(12) United States Patent
Hosaka et al.

(10) Patent No.: US 7,517,619 B2
(45) Date of Patent: Apr. 14, 2009

(54) DYE-CONTAINING RESIST COMPOSITION AND COLOR FILTER USING SAME

(75) Inventors: Kazuyoshi Hosaka, Funabashi (JP); Mariko Shudo, Funabashi (JP); Masayoshi Suzuki, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 676 days.

(21) Appl. No.: 10/918,466

(22) Filed: Aug. 16, 2004

(65) Prior Publication Data

US 2005/0095530 A1    May 5, 2005

(30) Foreign Application Priority Data

Aug. 21, 2003   (JP)   ............... 2003-296986

(51) Int. Cl.
*G02B 5/20* (2006.01)
*G03F 7/00* (2006.01)

(52) U.S. Cl. .................. 430/7; 430/270.1; 349/106; 313/498; 257/440

(58) Field of Classification Search ................. None
See application file for complete search history.

(56) References Cited

U.S. PATENT DOCUMENTS 5,968,688 A * 10/1999 Masuda et al. .............. 430/7
6,165,676 A    12/2000 Hattori
6,238,841 B1    5/2001 Morigaki
6,653,778 B1 * 11/2003 Tomiuchi et al. ............ 313/501

FOREIGN PATENT DOCUMENTS

| JP | 62-169163 | * | 7/1987 |
|----|-----------|---|--------|
| JP | 62-169163 A | | 7/1987 |
| JP | A 4-163552 | | 6/1992 |
| JP | A 6-51514 | | 2/1994 |
| JP | 2002-014470 A | | 1/2002 |
| JP | 2002-049149 A | | 2/2002 |
| JP | 2004-199040 A | | 7/2004 |
| WO | WO 03/058345 A2 | | 7/2003 |
| WO | WO 03/062924 A1 | | 7/2003 |

* cited by examiner

*Primary Examiner*—John A. McPherson
(74) *Attorney, Agent, or Firm*—Oliff & Berridge, PLC

(57) ABSTRACT

There is provided a dye-containing resist composition comprising a ketol solvent; a negative type resist composition comprising a resin, a photoacid generator or a photobase generator, a crosslinking compound, a dye and a ketol solvent; a negative type resist composition comprising a resin, a photoradical generator, a crosslinking compound, a dye and a ketol solvent; a positive type resist composition comprising a resin, a photoacid generator, a crosslinking compound, a dye and a ketol solvent. The ketol is preferably β-hydroxyketone, more preferably 4-hydroxy-4-methyl-2-pentanone. The resist composition does not occur problems such as occurrence of foreign matters (particles) even when the concentration of dye is increased, and enables the production of color filters in a shape of thinner film.

8 Claims, No Drawings

DYE-CONTAINING RESIST COMPOSITION AND COLOR FILTER USING SAME

BACKGROUND OF THE INVENTION

1. Field of the Invention

The present invention relates to a dye-containing resist composition and a color filter using the same.

2. Description of the Related Art

As color filters for image sensing devices such as solid-state image sensing devices or liquid crystal display devices make possible to form fine patterns and therefore make possible to produce highly fine color filters, they are mainly produced by using a method of forming a pattern with a photoresist to which coloring matters are added. In this method, a resist composition comprising a coloring matter and a polymer resin is used, and a color filter is produced by repeating the following process for each color, in which the process comprises coating the composition on a substrate to form a film, patterning the colored layer with a photolithographic process, developing to form one colored pattern.

In the method, coloring matters used as colorant generally include pigments that are excellent in heat resistance and light resistance, and a resist in which a pigment is dispersed is proposed. For example, Japanese Patent Laid-open No. Hei 4-163552 discloses a photosensitive coloring resin composition characterized by comprising a resinous material curable with an acid, a photoacid generator and a pigment, in which the resinous material comprises a resin containing phenol and a crosslinking agent having N-methylol structure.

However, as the pigments contain particles having a size of about 1 μm itself, a fine pattern can not be formed due to an effect of these particles. Therefore, this makes difficult to produce color filters for charge coupled device (CCD) for which a high resolution is required.

On the other hand, when dyes are used as coloring matter, the dyes give homogeneous compositions as the dyes are soluble in organic solvents. Therefore, resist compositions in which dyes are used enable formation of fine patterns compared with a resist composition in which pigments are dispersed. For example, Japanese Patent Laid-open No. Hei 6-51514 discloses a negative type resist composition containing a resin material curable with an acid, a crosslinking agent, a photoacid generator, a dye and a solvent. The solvent includes for example methyl cellosolve, ethyl cellosolve, methyl cellosolve acetate, ethyl cellosolve acetate, diethylene glycol dimethyl ether, ethylene glycol monoisopropyl ether, propylene glycol monomethyl ether, N,N-dimethyl acetamide, N-metylpyrrolidone, γ-butyrolactone, cyclohexanone, ethyl acetate, n-butyl acetate, propylene glycol monoethyl ether acetate, methyl lactate, ethyl lactate, ethyl pyruvate, dimethylformamide, and the like.

As dyes are generally low in solubility in organic solvents, it is difficult to increase the concentration of the dyes in resist compositions. In particular, when color filters in a shape of thinner film are requested, it is necessary to increase the concentration of dyes in resist compositions in order to realize a development of a prescribed emission spectrum. In addition, in case where a dye has a low compatibility with a resin, the dye becomes insoluble or is separated out while a resist composition is prepared from the dye, the resin and an organic solvent. Further, when a resist composition is restored, there are problems that a dye having a low solubility in an organic solvent is liable to be re-precipitated or re-crystallized, or that foreign matters (particles) are liable to occur.

SUMMARY OF THE INVENTION

An object of the present invention is to provide a color resist composition from which color filters in a shape of thinner film can be produced and which does not occur problems such as occurrence of foreign matters (particles) even when the concentration of dye is increased.

The present invention relates to the following aspects:

as a first aspect, a dye-containing resist composition comprising a ketol solvent;

as a second aspect, a negative type resist composition comprising a resin (a-1), a photoacid generator or a photobase generator (b-1), a crosslinking compound (c-1), a dye (d) and a ketol solvent (e);

as a third aspect, a negative type resist composition comprising a resin (a-2), a photoradical generator (b-2), a crosslinking compound (c-2), a dye (d) and a ketol solvent (e);

as a fourth aspect, a positive type resist composition comprising a resin (a-3), a photoacid generator (b-3), a crosslinking compound (c-3), a dye (d) and a ketol solvent (e);

as a fifth aspect, the resist composition as described in any one of the first to fourth aspects, wherein the solvent contains at least 1% by weight of a ketol based on total solvent;

as a sixth aspect, the resist composition as described in any one of the first to fifth aspects, wherein the ketol is β-hydroxyketone;

as a seventh aspect, the resist composition as described in any one of the first to fifth aspects, wherein the ketol is 4-hydroxy-4-methyl-2-pentanone;

as an eighth aspect, a method of producing a color filter comprising the steps of:
  coating the resist composition as described in any one of the first to seventh aspects on a substrate;
  drying;
  exposing; and
  developing;

as a ninth aspect, a color filter produced by the method as described in the eighth aspect;

as a tenth aspect, a solid-state image sensing device having the color filter produced by the method as described in the eighth aspect;

as an eleventh aspect, a liquid crystal display device having the color filter produced by the method as described in the eighth aspect; and as a twelfth aspect, a light emitting diode display device having the color filter produced by the method as described in the eighth aspect.

In the present invention, in order to provide a color resist composition from which color filters in a shape of thinner film can be produced, which maintains a good solubility of dye even when the concentration thereof is increased and which does not occur problems such as occurrence of foreign matters (particles) accompanied by precipitation of the dye upon a long-term storage, that is, has a high shelf stability, it is found to use as solvent a ketol solvent, preferably β-hydroxyketone, most preferably 4-hydroxy-4-methyl-2-pentanone.

Ketol is also called hydroxyketone, and is a general term for ketones having hydroxy groups. Among ketols, β-hydroxyketone is preferable. This compound has an increased mutual interaction with dye molecule and an increased solubility, and does not occur foreign matters (particles) accompanied by precipitation of the dye upon a change of temperature or a long-term storage, owing to a specific positional relationship (β-position) in a molecule between hydroxy group and carbonyl group of ketone. Among β-hydroxyketones, 4-hydroxy-4-methyl-2-pentanone is particularly excellent in the above-mentioned effects.

Consequently, solubility of dyes and compatibility of dyes with resins are increased, and a prescribed concentration of the dyes can be secured. Thereby, the present invention provides color filters which can realize a development of a prescribed emission spectrum.

DETAILED DESCRIPTION OF THE PREFERRED EMBODIMENTS

The present invention relates to a dye-containing resist composition comprising a ketol solvent. More specifically, the resist composition of the present invention can be applied for a negative type and a positive type ones.

The negative type resist composition includes a negative type resist composition comprising a resin (a-1), a photoacid generator or a photobase generator (b-1), a crosslinking compound (c-1), a dye (d) and a ketol solvent (e) as a first embodiment; and a negative type resist composition comprising a resin (a-2), a photoradical generator (b-2), a crosslinking compound (c-2), a dye (d) and a ketol solvent (e) as a second embodiment.

In addition, the positive type resist composition includes a positive type resist composition comprising a resin (a-3), a photoacid generator (b-3), a crosslinking compound (c-3), a dye (d) and a ketol solvent (e).

The resin used in the negative type resist composition includes a resin (a-1) curable with an acid or a base generated by heat or light irradiation, and a photosensitive resin (a-2) crosslinkable with heat or light irradiation. The resin is not specifically limited so long as an unexposed part of coating comprising the resin can be removed with a developer.

The resin (a-1) is for example a resin having hydroxy group or carboxy group.

They include for example acrylic resins such as polyvinyl alcohol, polyacrylamide, polyacrylic acid and polymethacrylic acid, polyamide acid, polyhydroxy styrene, polyhydroxy styrene derivative, copolymer of polymethacrylate with maleic anhydride, phenol resin, novolak resin, polyimide containing hydroxy group and/or carboxy group, cellulose, cellulose derivative, starch, chitin, chitosan, gelatin, zein, polysaccharide, polyamide, polyethylene terephthalate, polycarbonate, polyurethane and polysiloxane. These resins are used alone or in a combination of two or more.

In particular, polyhydroxy styrene, polyhydroxy styrene derivative, phenol resin and novolak resin are preferable.

The acrylic resin containing carboxy group includes acrylic copolymer prepared by copolymerizing (meth)acrylate as main component with ethylenic unsaturated carboxylic acid and optionally other monomer.

The (meth)acrylate includes methyl(meth)acrylate, ethyl (meth)acrylate, propyl(meth)acrylate, butyl(meth)acrylate, hexyl(meth)acrylate, 2-ethylhexyl(meth)acrylate, cyclohexyl(meth)acrylate, benzyl(meth)acrylate, dimethylamino(meth)acrylate, hydroxyethyl(meth)acrylate, hydroxypropyl(meth)acrylate and glycidyl(meth)acrylate.

The ethylenic unsaturated carboxylic acid includes acrylic acid, methacrylic acid, crotonic acid, maleic acid, fumaric acid, itaconic acid, and acid anhydrides or half esters thereof. Among them, acrylic acid, methacrylic acid and maleic acid are preferable.

The acrylic copolymer has a weight average molecular weight of 1,000 to 100,000, and preferably 2,000 to 30,000 from the standpoint of performance of developing or adhesion. They may be used in a combination if necessary, and may be used alone or in a mixture of two or more.

The polyhydroxy styrene and polyhydroxy styrene derivative include monopolymer of vinyl phenol, and copolymer of vinyl phenol with other compound. The other compound includes styrene derivative such as acrylic acid derivative, acrylonitrile, methacrylic acid derivative, methacrylonitrile, styrene, α-methyl styrene, p-methyl styrene, o-methyl styrene, p-methoxy styrene and p-chloro styrene.

The polyhydroxy styrene and polyhydroxy styrene derivative have a weight average molecular weight of 1,000 to 100,000, and preferably 2,000 to 30,000 from the standpoint of performance of developing or adhesion. They may be used in a combination if necessary, and may be used alone or in a mixture of two or more.

The novolak resin includes compounds prepared by condensing a phenol compound with an aldehyde compound or a ketone compound in the presence of an acid catalyst.

The phenol compound includes phenol, m-cresol, p-cresol, o-cresol, m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol, p-methoxy phenol, m-methoxy phenol, p-ethoxy phenol, m-ethoxy phenol, p-propoxy phenol, m-propoxy phenol, o-isopropenyl phenol, p-isopropenyl phenol, 2-methyl-4-isopropenyl phenol, 2-ethyl-4-isopropenyl phenol, 2,3-xylenol, 2,5-xylenol, 3,5-xylenol, 3,4-xylenol, resorcinol, hydroquinone, 4,4-dihydroxy biphenyl, phenyl phenol, catechol, pyrogallol, naphthol, bisphenol C and bisphenol A, etc. These phenol compounds may be used alone or in a combination of two or more.

The aldehyde compound include formaldehyde, paraformaldehyde, acetaldehyde, trioxane, propionaldehyde, butylaldehyde, trimethylacetaldehyde, acrolein, crotonaldehyde, cyclohexane aldehyde, furfural, furylacrolein, benzaldehyde, terephthal aldehyde, phenyl acetaldehyde, α-phenyl propylaldehyde, β-phenyl propylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde and cinnamaldehyde, etc. These aldehyde compounds may be used alone or in a combination of two or more.

The ketone compound includes acetone, methyl ethyl ketone, diethyl ketone and diphenyl ketone, etc. These ketone compounds may be used alone or in a combination of two or more.

The acid catalyst used in the condensation reaction includes hydrochloric acid, sulfuric acid, formic acid, oxalic acid and p-toluene sulfonic acid, etc.

The novolak resin has a weight average molecular weight of 1,000 to 100,000, and preferably 2,000 to 30,000 from the standpoint of performance of developing or adhesion. They may be used in a combination if necessary, and may be used alone or in a mixture of two or more.

As resin (a-2) having a photosensitive group which can be crosslinked with heat or light irradiation, acrylic resins containing carboxy group can be used. That is, the resin is an acrylic copolymer prepared by coplymerizing a (meth)acrylate as main component with an ethylenic unsaturated carboxylic acid and optionally other monomer.

The (meth)acrylate includes methyl(meth)acrylate, ethyl (meth)acrylate, propyl(meth)acrylate, butyl(meth)acrylate, hexyl(meth)acrylate, 2-ethylhexyl(meth)acrylate, cyclohexyl(meth)acrylate, benzyl(meth)acrylate, dimethylamino (meth)acrylate, hydroxyethyl(meth)acrylate, hydroxypropyl (meth)acrylate and glycidyl(meth)acrylate.

The ethylenic unsaturated carboxylic acid includes acrylic acid, methacrylic acid, crotonic acid, maleic acid, fumaric acid, itaconic acid, and acid anhydrides or half esters thereof. Among them, acrylic acid, methacrylic acid and maleic acid are preferable.

The other monomer includes acrylamide, methacrylamide, acrylonitrile, methacrylonitrile, styrene, α-methyl styrene, vinyl acetate and alkyl vinyl ether, etc.

The acrylic copolymer has a weight average molecular weight of 1,000 to 100,000, and preferably 2,000 to 30,000 from the standpoint of performance of developing or adhesion. They may be used in a combination if necessary, and may be used alone or in a mixture of two or more.

The photoacid generator among the photoinitiator (b-1) used in case where resin (a-1) is used is not specifically limited so long as it generates an acid directly or indirectly with light irradiation. Concrete examples thereof include triazine compounds, acetophenone derivative compounds, disulfone compounds, diazomethane compounds, sulfonic acid derivative compounds, diaryliodonium salts, triaryl sulfonium salts, triaryl phosphonium salts and iron arene complex, etc. to which the present invention is not limited. Further concretely, the photoacid generator includes the following compounds: diphenyliodonium chloride, diphenyliodonium trifluoromethane sulfonate, diphenyliodonium mesylate, diphenyliodonium tosylate, diphenyliodonium bromide, diphenyliodonium tetrafluoroborate, diphenyliodonium hexafluoroantimonate, diphenyliodonium hexafluoro arsenate, bis(p-tert-butylphenyl)iodonium hexafluorophosphate, bis(p-tert-butylphenyl)iodonium mesylate, bis(p-tert-butylphenyl)iodonium tosylate, bis(p-tert-butylphenyl)iodonium trifluoromethane sulfonate, bis(p-tert-butylphenyl)iodonium tetrafluoroborate, bis(p-tert-butylphenyl)iodonium chloride, bis(p-chlorophenyl)iodonium chloride, bis(p-chlorophenyl)iodonium tetrafluoroborate, triphenylsulfonium chloride, triphenyl sulfonium bromide, tri(p-methoxyphenyl) sulfonium tetrafluoroborate, tri(p-methoxyphenyl)sulfonium hexafluoro phosphonate, tri(p-ethoxyphenyl)sulfonium tetrafluoroborate, triphenylphosphonium chloride, triphenylphosphonium bromide, tri(p-methoxyphenyl)phosphonium tetrafluoroborate, tri(p-methoxyphenyl)phosphonium hexafluorophosphonate, tri(p-ethoxyphenyl)phosphonium tetrafluoroborate.

In addition, the photoacid generators represented by formulae (1) to (68) can be used.

(1)
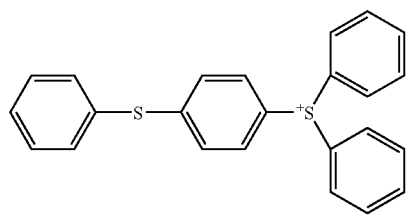

(2)
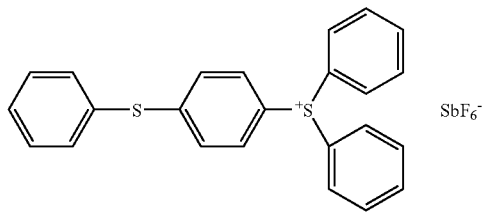

(3)
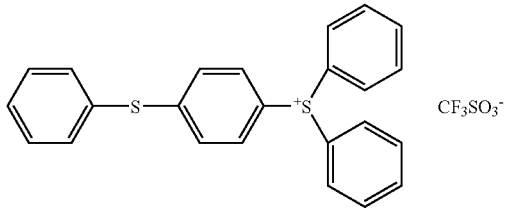

(4)
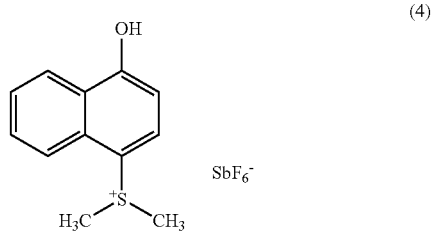

(5)
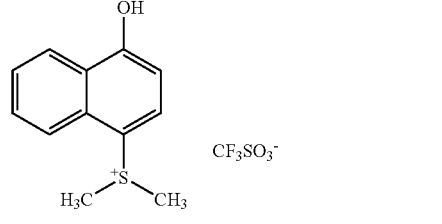

(6)
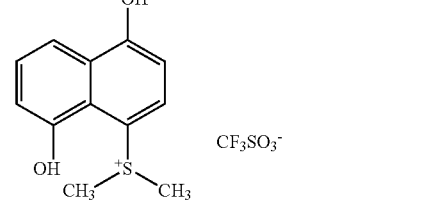

(7)
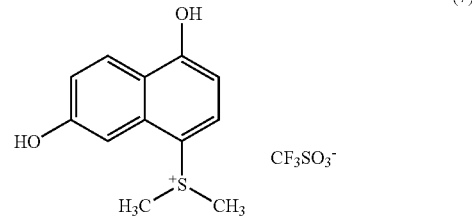

(8)
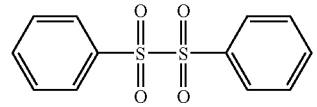

(9)
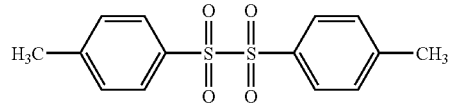

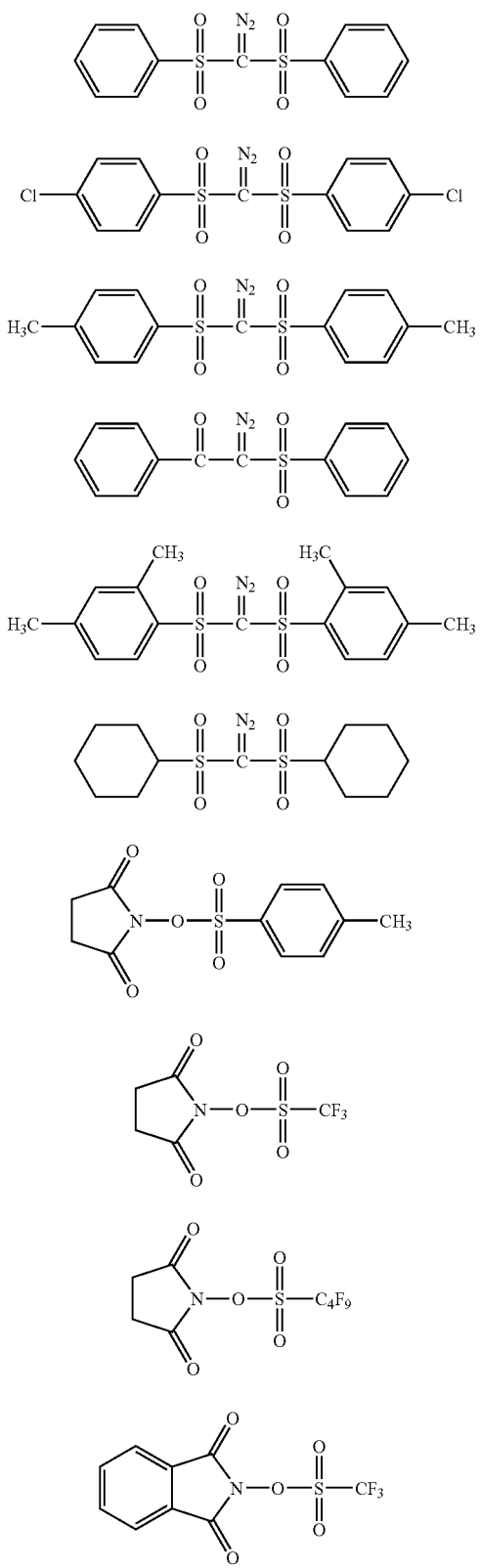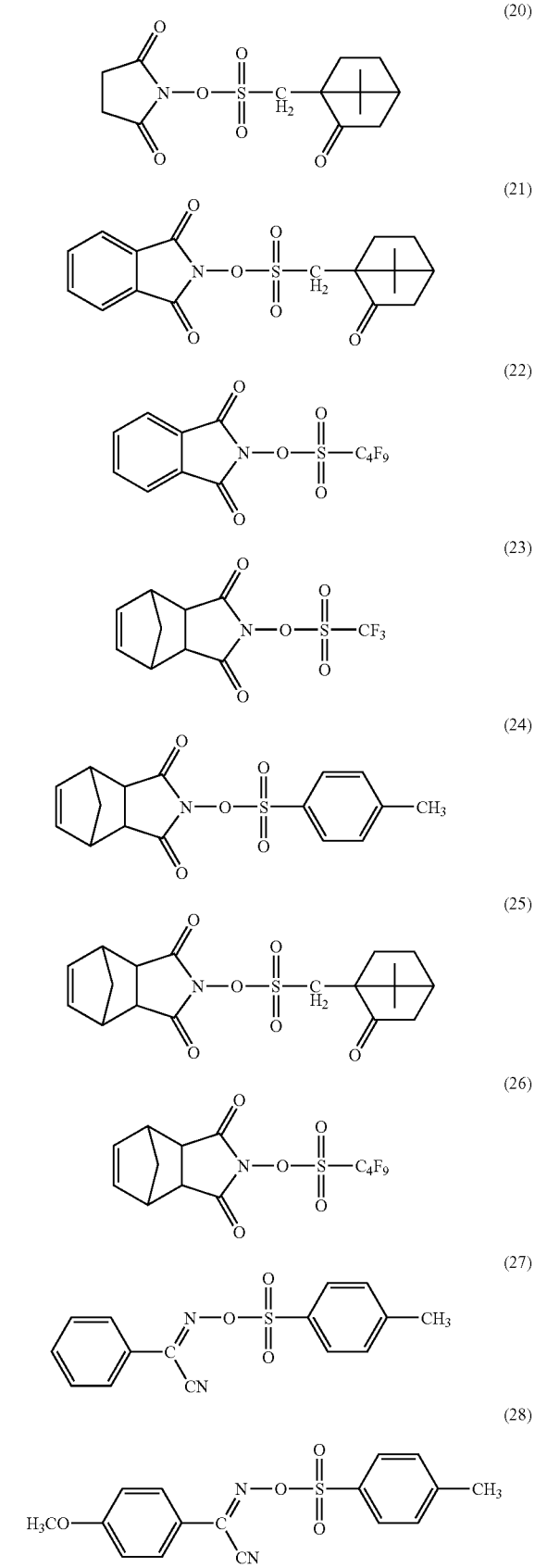

-continued
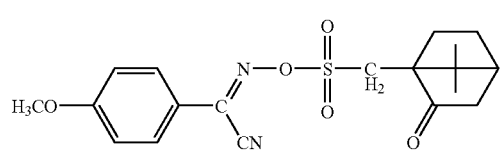 (29)
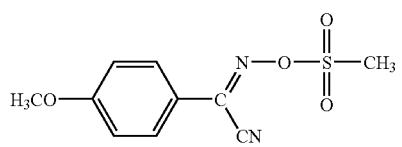 (30)
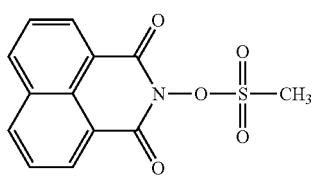 (31)
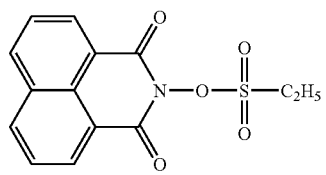 (32)
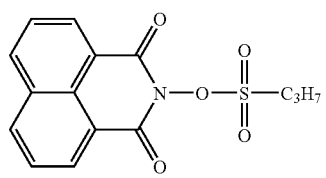 (33)
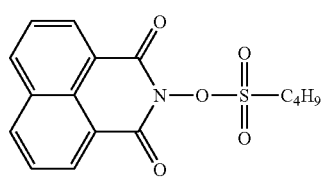 (34)
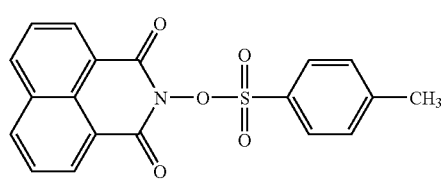 (35)
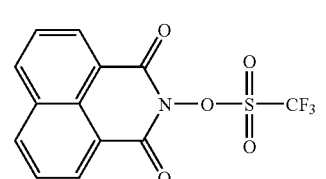 (36)
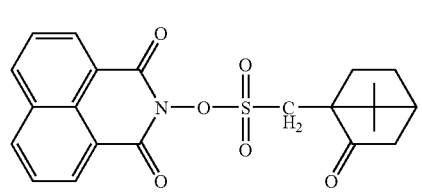 (37)
-continued
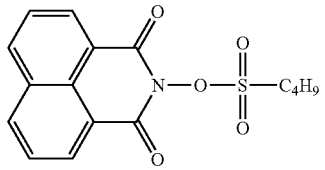 (38)
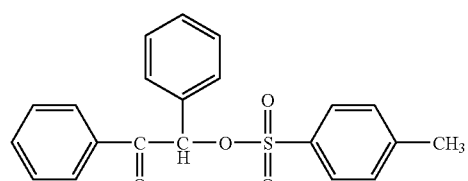 (39)
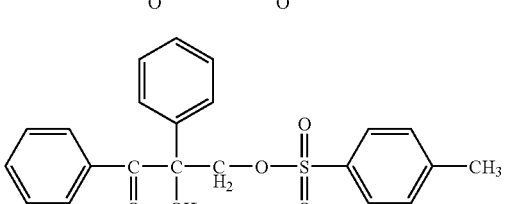 (40)
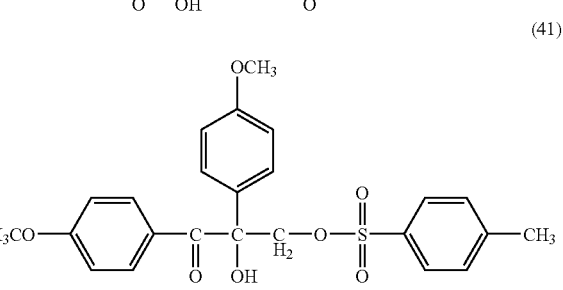 (41)
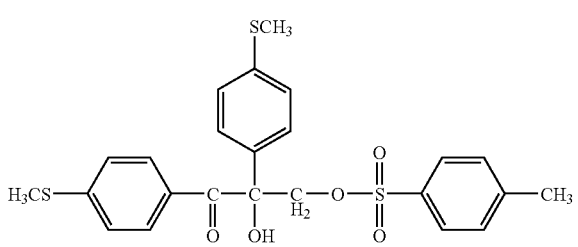 (42)
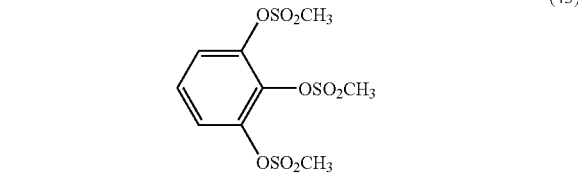 (43)
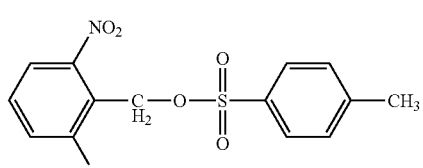 (44)
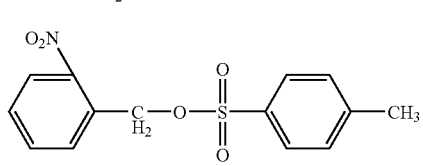 (45)

-continued
(46)
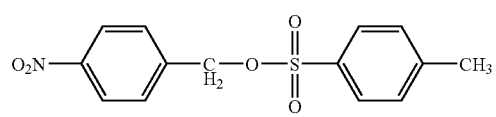
(47)
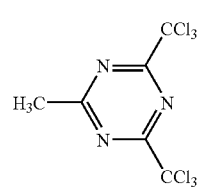
(48)
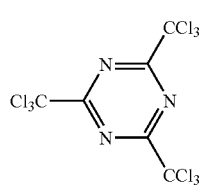
(49)
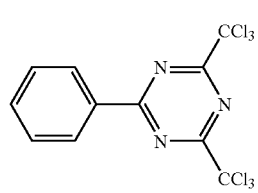
(50)
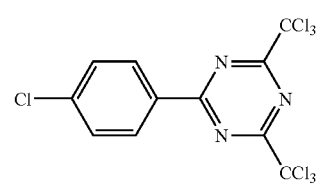
(51)
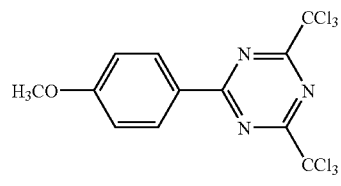
(52)
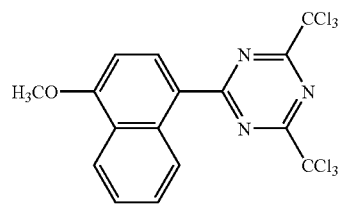
(53)
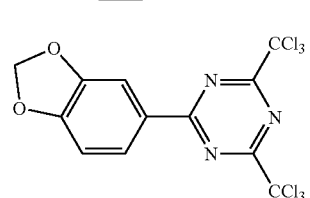
-continued
(54)
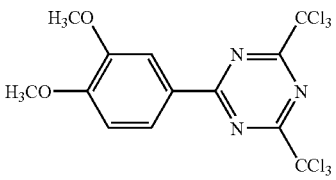
(55)
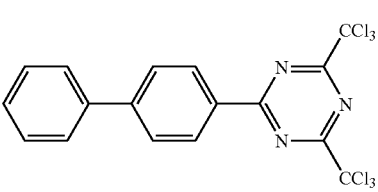
(56)
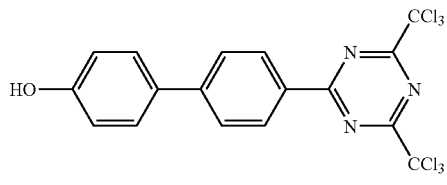
(57)
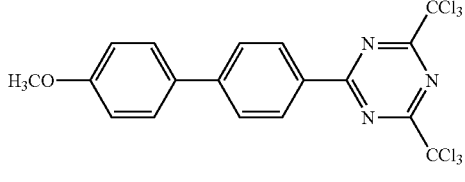
(58)
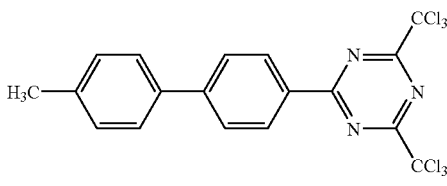
(59)
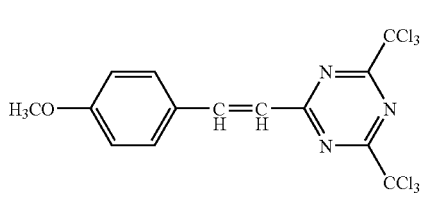
(60)
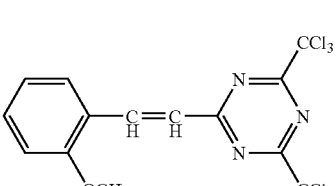
(61)
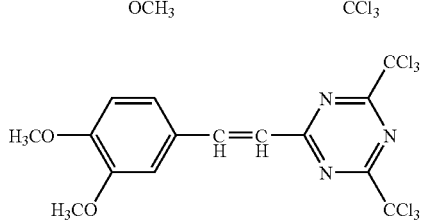

-continued

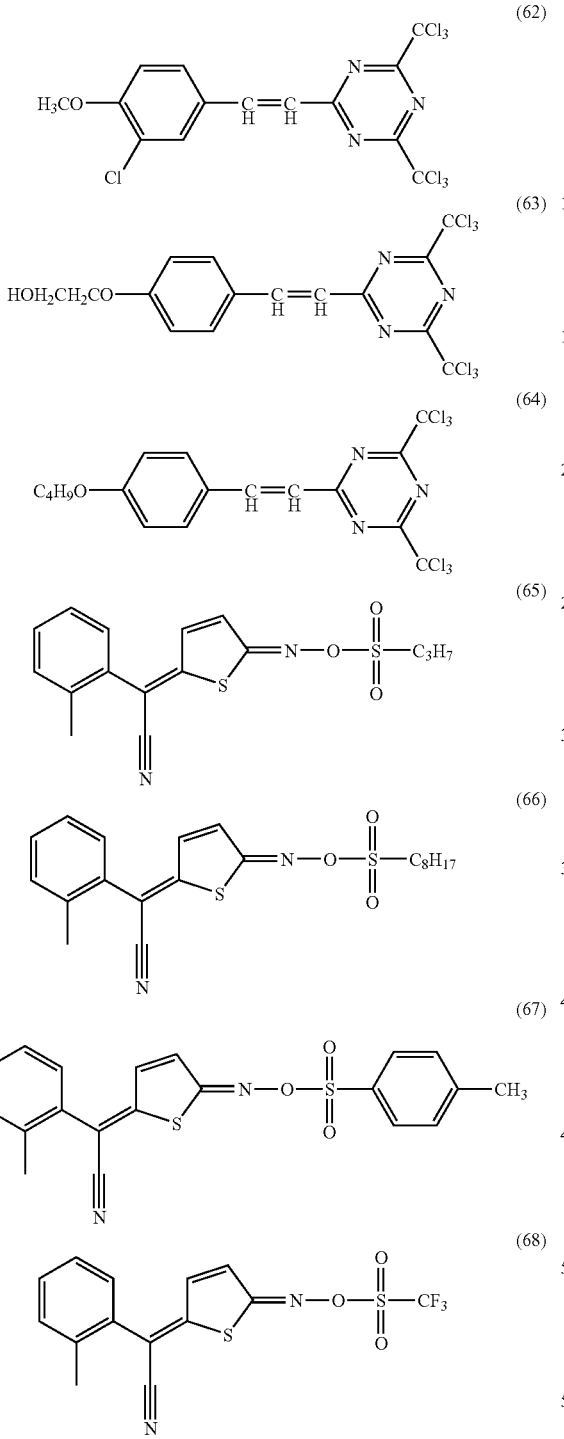

These photoacid generators may be used alone or in a combination of two or more. The amount to be introduced is selected from a range of 1 to 100 parts by weight based on 100 parts by weight of resin (a-1) component. When the amount is less than 1 part by weight, crosslink reaction does not fully proceed, and it becomes difficult to obtain a desired resist pattern. On the other hand, when the amount is more than 100 parts by weight, the resist composition has a low shelf stability. Therefore, the amount of the photoacid generator to be introduced is preferably 1 to 100 parts by weight based on 100 parts by weight of resin (a-1) component.

The photobase generator is not specifically limited so long as it generates a base directly or indirectly with light irradiation. The photobase generator includes for example bis[[(2-nitrobenzyl)oxy]carbonylhexane-1,6-diamine], nitrobenzyl cyclohexyl carbamate, di(methoxybenzyl)hexamethylene dicarbamate and the compounds of formulae (69) to (71).

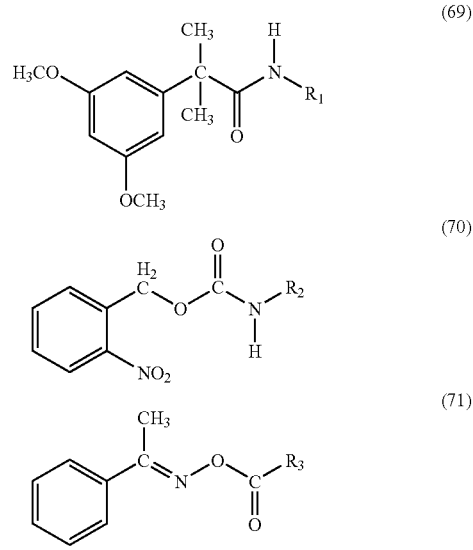

In these formulae (69) to (71), $R_1$, $R_2$ and $R_3$ are hydrogen atom, a substituted or unsubstituted alkyl, or a substituted or unsubstituted phenyl.

These photobase generators may be used alone or in a combination of two or more similarly to the photoacid generators. The amount to be introduced is preferably 1 to 100 parts by weight based on 100 parts by weight of resin (a-1) component from the same reason as the above-mentioned one.

The photoradiacal generator (b-2) used along with resin (a-2) includes for example organic peroxides such as tert-butylperoxy-iso-butarate, 2,5-dimethyl-2,5-bis(benzoyl-dioxy)hexane, 1,4-bis[α-(tert-butyldioxy)-iso-propoxy]benzene, di-tert-butylperoxide, 2,5-dimethyl-2,5-bis(tert-butyldioxy)hexene hydroperoxide, α-(iso-propylphenyl)-iso-propylhydroperoxide, 2,5-dimethylhexane, tert-butylhydroperoxide, 1,1-bis(tert-butyldioxy)-3,3,5-trimethylcyclohexane, butyl-4,4-bis(tert-butyldioxy) valerate, cyclohexanone peroxide, 2,2',5,5'-tetra(tert-butylperoxycarbonyl)benzophenone, 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3'-bis(tert-butylperoxycarbonyl)-4,4'-dicarboxy benzophenone, tert-butylperoxy benzoate or di-tert-butyidiperoxy isophthalate, quinones such as 9,10-anthraquinone, 1-chloroanthraquinone, 2-chloroanthraquinone, octamethylanthraquinone or 1,2-benzanthraquinone, or benzoin derivatives such as benzoin methyl, benzoin ethylether, α-methylbenzoin or α-phenylbenzoin.

These photoradical generators may be used alone or in a combination of two or more. The amount to be introduced is preferably 1 to 100 parts by weight based on 100 parts by weight of resin (a-2) component from the same reason as the above-mentioned one.

Further, as photosensitizer, prior known photosensitizers may be used. The photosensitizer includes for example thioxanthenes, xanthenes, ketones, thiopyrylium salts, basestyryls, merocyanines, 3-substituted coumarins, 3,4-substituted coumarins, cyanines, acridines, thiazines, phenothiazines, anthracenes, coronenes, benzanthracenes, perylenes, ketocoumarines, fumarines and borates. These may be used alone or in a combination of two or more.

The crosslinking compound (c-1) used along with resin (a-1) is not specifically limited so long as it is a compound having at least one crosslink-forming group selected from the group consisting of hydroxy, hydroxyalkyl and lower alkoxyalkyl.

The crosslinking compound includes for example amino resins having hydroxy or alkoxy, such as melamine resins, urea resins, guanamine resins, glycoluril-formaldehyde resins, succinylamide-formaldehyde resins and ethylene urea-formaldehyde resins.

For example, the crosslinking compound (c-1) may be melamine derivatives, benzoguanamine derivatives or glycolurils in which a hydrogen atom of the amino group is substituted with a methylol or an alkoxymethyl or both of them. The melamine derivatives and benzoguanamine derivatives may be present in a dimer or trimer. These preferably have on average three to six methylol or alkoxymethyl groups per triazine ring.

The melamine derivatives and benzoguanamine derivatives include for example commercially available products, such as MX-750 having on average 3.7 substituted methoxymethyl groups per triazine ring, MW-30 having on average 5.8 substituted methoxymethyl groups per triazine ring (the above-mentioned two products are manufactured by Sanwa Chemical Co., Ltd.), or methoxymethylated melamines such as Cymel 300, 301, 303, 350, 370, 771, 325, 327, 703 or 712, methoxymethylated butoxymethylated melamines such as Cymel 235, 236, 238, 212, 253 or 254, butoxymethylated melamines such as cymel 506, or 508, carboxy-containing methoxymethylated isobutoxymethylated melamines such as Cymel 1141, methoxymethylated ethoxymethylated benzoguanamines such as Cymel 1123, methoxymethylated benzoguanamines such as Cymel 1123-10, butoxymethylated benzoguanamines such as Cymel 1128, carboxy-containing methoxymethylated ethoxymethylated benzoguanamines such as Cymel 1125-80 (the above-mentioned products are manufactured by Mitsui Cytec Co., Ltd.). In addition, glycolurils include for example butoxymethylated glycolurils such as Cymel 1170, or methylol glycolurils such as Cymel 1172.

In addition, benzene or phenol compounds having hydroxy or alkoxy group include for example 1,3,5-tris(methoxymethoxy)benzene, 1,2,4-tris(isopropoxymethoxy)benzene, 1,4-bis(sec-butoxymethoxy)benzene, 2,6-dihydroxymethyl-p-tert-butylphenol and the like.

Further, compounds containing epoxy or isocyanate group and having crosslink-forming group may be used. Concrete examples include for example bisphenolacetone glycidyl ether, phenol novolak epoxy resin, cresol novolak epoxy resin, triglycidyl isocyanurate, tetraglycidyl aminodiphenylene, tetraglycidyl-m-xylene diamine, tetraglycidyl-1,3-bis(aminoethyl)cyclohexane, tetraphenylglycidyl ether ethane, triphenylglycidyl ether ethane, bisphenol hexafluoro-acetodiglycidyl ether, 1,3-bis(1-(2,3-epoxypropoxy)-1-trifluoromethyl-2,2,2-trifluoromethyl)benzene, 4,4-bis(2,3-epoxypropoxy)octafluorobiphenyl, triglycidyl-p-aminophenol, tetraglycidylmetaxylene diamine, 2-(4-(2,3-epoxypropoxy)phenyl)-2-(4-(1,1-bis((4-2,3-epoxypropoxy)phenyl)ethyl)phenyl)propane, 1,3-bis(4-(1-(4-(2,3-epoxypropoxy)phenyl-1-(4-(1-(4-(2,3-epoxypropoxyphenyl)-1-methylethyl)phenyl)ethyl)phenoxy)-2-propanol and the like.

These crosslinking compounds (c-1) may be used alone or in a combination of two or more. The amount to be introduced is selected from a range of 1 to 200 parts by weight based on 100 parts by weight of resin (a-1) component. When the amount is less than 1 part by weight, crosslink reaction does not fully proceed, and it becomes difficult to obtain a desired resist pattern. On the other hand, when the amount is more than 200 parts by weight, the resist composition has a low shelf stability. Therefore, the amount of the crosslinking compound to be introduced is preferably 1 to 200 parts by weight based on 100 parts by weight of resin (a-1) component.

The crosslinking compound (c-2) used along with resin (a-2) includes the following compounds having polymerizable unsaturated group. Concretely, the compound includes compounds having three polymerizable unsaturated groups in a molecule, such as trimethylol propane tri(meth)acrylate, pentaerythritol tri(meth)acrylate, dipentaerythritol penta(meth)acrylate, tri(meth)acryloyloxy ethoxytrimethylol propane or glycerin polyglycidylether poly(meth)acrylate, compounds having two polymerizable unsaturated groups in a molecule, such as ethylene glycol di(meth)acrylate, diethylene glycol di(meth)acrylate, tetraethylene di(meth)acrylate, polyethylene glycol di(meth)acrylate, propylene glycol di(meth)acrylate, polypropylene glycol di(meth)acrylate, butylene glycol di(meth)acrylate, neopentyl glycol di(meth)acrylate, ethyleneoxide bisphenol A di(meth)acrylate, propyleneoxide bisphenol di(meth)acrylate, 1,6-hexanediol di(meth)acrylate, glycerin di(meth)acrylate, pentaerythritol di(meth)acrylate, ethylene glycol diglycidylether di(meth)acrylate, dietylene glycol diglycidylether di(meth)acrylate, phthalic acid diglycidyl ester di(meth)acrylate or hydroxypivalic acid neopentyl glycol di(meth)acrylate, and compounds having one polymerizable unsaturated groups in a molecule, such as 2-hydroxyethyl(meth)acrylate, 2-hydroxypropyl(meth)acrylate, 2-hydroxybutyl(meth)acrylate, 2-phenoxy-2-hydroxypropyl(meth)acrylate, 2-(meth)acryloyloxy-2-hydroxypropylphthalate, 3-chloro-2-hydroxypropyl(meth)acrylate, glycerin mono(meth)acrylate, 2-(meth)acryloyloxyethyl phosphate or N-methylol(meth)acrylamide.

These crosslinking compounds may be used alone or in a combination of two or more. The amount to be introduced is selected from a range of 1 to 200 parts by weight based on 100 parts by weight of resin (a-2) component. When the amount is less than 1 part by weight, crosslink reaction does not fully proceed, and it becomes difficult to obtain a desired resist pattern. On the other hand, when the amount is more than 200 parts by weight, the resist composition has a low shelf stability. Therefore, the amount of the crosslinking compound to be introduced is preferably 1 to 200 parts by weight based on 100 parts by weight of resin (a-2) component.

Resin (a-3) used in the positive type resist composition is not specifically limited so long as it is a resin curable with heat, decomposed with an acid generated by heat or light irradiation, the polarity or molecular weight thereof is changed to become soluble in a developer, and exposed coating can be removed with the developer.

Resin (a-3) is for example a resin having hydroxy or carboxy group, and the like. Concretely, the resin includes for example polyvinyl alcohol, polyacrylamide, poly(acrylic acid), poly(methacrylic acid), poly(amic acid), polyhydroxy styrene, polyhydroxy styrene derivative, copolymer of polymathacrylate with maleic anhydride, phenol resin and novolak resin, polyimide, cellulose derivative, polysaccharide, polyamide, polyethylene terephthalate, polycarbonate, polyurethane and polysiloxane containing hydroxy and/or carboxy group. More concretely, resin (a-3) includes resins illustrated for the above-mentioned resin (a-1). These resins may be used alone or in a combination of two or more.

Further, acrylic resins containing carboxy group may be used. That is, the resin is an acrylic copolymer prepared by copolymerizing (meth)acrylate as main component with ethylenic unsaturated carboxylic acid and optionally other monomer. Concretely, the resin includes ones illustrated for the above-mentioned resin (a-2). These resins may be used alone or in a combination of two or more.

Photoacid generator (b-3) used in the positive type resist composition includes naphthoquinone diazide compounds. Generally, 1,2-quinone diazide compounds are used. The compound includes for example 1,2-benzoquinone diazide sulfonate, 1,2-naphthoquinone diazide sulfonate, 1,2-benzoquinone diazide sulfonamide and 1,2-naphthoquinone diazide sulfonamide, etc. More concretely, the photoacid generator (b-3) includes 2,3,4-trihydroxybenzophenone-1,2-naphthoquinone diazide-4-sulfonate, 2,3,4-trihydroxybenzophenone-1,2-naphthoquinone diazide-5-sulfonate, 2,4,6-trihydroxybenzophenone-1,2-naphthoquinone diazide-4-sulfonate, 2,4,6-trihydroxyhydroxybenzophenone-1,2-naphthoquinone diazide-5-sulfonate, 2,2',4,4'-tetrahydroxybenzophenone-1,2-naphthoquinone diazide-4-sulfonate, 2,2',4,4'-tetrahydroxybenzophenone-1,2-naphthoquinone diazide-5-sulfonate, 2,3,4,3'-tetrahydroxybenzophenone-1,2-naphthoquinone diazide-4-sulfonate, 2,3,4,3'-tetrahydroxybenzophenone-1,2-naphthoquinone diazide-5-sulfonate, 2,3,4,4'-tetrahydroxybenzophenone-1,2-naphthoquinone diazide-4-sulfonate, 2,3,4,4'-tetrahydroxybenzophenone-1,2-naphthoquinone diazide-5-sulfonate, 2,3,4,2'-tetrahydroxy-4'-methylbenzophenone-1,2-naphthoquinone diazide-4-sulfonate, 2,3,4,2'-tetrahydroxy-4'-methylbenzophenone-1,2-naphthoquinone diazide-5-sulfonate, 2,3,4,4'-tetrahydroxy-3'-methoxybenzophenone-1,2-naphthoquinone diazide-4-sulfonate, 2,3,4,4'-tetrahydroxy-3'-methoxybenzophenone-1,2-naphthoquinone diazide-5-sulfonate, 2,3,4,2',6-pentahydroxybenzophenone-1,2-naphthoquinone diazide-4-sulfonate, 2,3,4,2',6-pentahydroxybenzophenone-1,2-naphthoquinone diazide-5-sulfonate, 2,4,6,3',4',5'-hexahydroxybenzophenone-1,2-naphthoquinone diazide-4-sulfonate, 2,4,6,3',4',5'-hexahydroxybenzophenone-1,2-naphthoquinone diazide-5-sulfonate, 3,4,5,3',4',5'-hexahydroxybenzophenone-1,2-naphthoquinone diazide-4-sulfonate, 3,4,5,3',4',5'-hexahydroxybenzophenone-1,2-naphthoquinone diazide-5-sulfonate, bis(2,4-dihydroxyphenyl)methane-1,2-naphthoquinone diazide-4-sulfonate, bis(2,4-dihydroxyphenyl)methane-1,2-naphthoquinone diazide-5-sulfonate, bis(p-hydroxyphenyl) methane-1,2-naphthoquinone diazide-4-sulfonate, bis(p-hydroxyphenyl)methane-1,2-naphthoquinone diazide-5-sulfonate, tri(p-hydroxyphenyl)methane-1,2-naphthoquinone diazide-4-sulfonate, tri(p-hydroxyphenyl) methane-1,2-naphthoquinone diazide-5-sulfonate, 1,1,1-tri (p-hydroxyphenyl)ethane-1,2-naphthoquinone diazide-4-sulfonate, 1,1,1-tri(p-hydroxyphenyl)ethane-1,2-naphthoquinone diazide-5-sulfonate, bis(2,3,4-trihydroxyphenyl)ethane-1,2-naphthoquinone diazide-4-sulfonate, bis(2,3,4-trihydroxyphenyl)ethane-1,2-naphthoquinone diazide-5-sulfonate, 2,2-bis(2,3,4-trihydroxyphenyl)propane-1,2-naphthoquinone diazide-4-sulfonate, 2,2-bis(2,3,4-trihydroxyphenyl)propane-1,2-naphthoquinone diazide-5-sulfonate, 1,1,3-tris(2,5-dimethyl-4-hydroxyphenyl)-3-phenylpropane-1,2-naphthoquinone diazide-4-sulfonate, 1,1,3-tris(2,5-dimethyl-4-hydroxyphenyl)-3-phenylpropane-1,2-naphthoquinone diazide-5-sulfonate, 4,4'-[1-[4-[1-[4-hydroxyphenyl]-1-methylethyl]phenyl]ethylidene] bisphenol-1,2-naphthoquinone diazide-4-sulfonate, 4,4'-[1-[4-[1-[4-hydroxyphenyl]-1-methylethyl]phenyl]ethylidene] bisphenol-1,2-naphthoquinone diazide-5-sulfonate, bis(2,5-dimethyl-4-hydroxyphenyl)-2-hydroxyphenylmethane-1,2-naphthoquinone diazide-4-sulfonate, bis(2,5-dimethyl-4-hydroxyphenyl)-2-hydroxyphenylmethane-1,2-naphthoquinone diazide-5-sulfonate, 3,3,3',3'-tetramethyl-1,1'-spiro-bi-indene-5,6,7,5',6',7'-hexanol-1,2-naphthoquinone diazide-4-sulfonate, 3,3,3',3'-tetramethyl-1,1'-spiro-bi-indene-5,6,7,5',6',7'-hexanol-1,2-naphthoquinone diazide-5-sulfonate, 2,2,4-trimethyl-7,2',4'-trihydroxyflavan-1,2-naphthoquinone diazide-4-sulfonate, 2,2,4-trimethyl-7,2',4'-trihydroxyflavan-1,2-naphthoquinone diazide-5-sulfonate, 2,3,4-tridroxybenzophenone-1,2-naphthoquinone diazide-4-sulfonate and the like.

These naphthoquinone diazide compounds may be used alone or in a combination of two or more. The amount to be introduced is selected from a range of 1 to 50 parts by weight based on 100 parts by weight of resin (a-3) component. When the amount is less than 1 part by weight, crosslink reaction does not fully proceed, and it becomes difficult to obtain a desired resist pattern. On the other hand, when the amount is more than 50 parts by weight, the resist composition has a low shelf stability. Therefore, the amount of the naphthoquinone diazide compound to be introduced is preferably 1 to 50 parts by weight based on 100 parts by weight of resin (a-3) component.

The crosslinking compound (c-3) used in the positive type resist composition is a compound having at least one crosslink-forming group selected from the group consisting of hydroxy, hydroxyalkyl and lower alkoxyalkyl, a compound containing an epoxy or isocyanate group and having a crosslink-forming group, or a compound having a polymerizable unsaturated group. Concretely, the compound includes compounds (c-1) illustrated for the above-mentioned negative type resist.

These crosslinking compounds (c-3) may be used alone or in a combination of two or more. The amount to be introduced is selected from a range of 1 to 200 parts by weight based on 100 parts by weight of resin (a-3) component. When the amount is less than 1 part by weight, crosslink reaction does not fully proceed, and it becomes difficult to obtain a desired resist pattern. On the other hand, when the amount is more than 200 parts by weight, the resist composition has a low shelf stability. Therefore, the amount of the crosslinking compound to be introduced is preferably 1 to 200 parts by weight based on 100 parts by weight of resin (a-3) component.

Dye (d) used in the negative type or positive type resist composition of the present invention is a compound which has an emission spectrum suitable for color filter and which dissolves in a solvent as such or dissolves therein in a shape of a modified dye. The dye includes acid dyes, oil-soluble dyes, disperse dyes, reactive dyes and direct dyes, etc. For example, the dye are azo dyes, benzoquinone dyes, naphthoquinone dyes, anthraquinone dyes, cyanine dyes, squarilium dyes, croconium dyes, melocyanine dyes, stilbene dyes, diphenylmethane dyes, triphenylmethane dyes, fluororane dyes, spiropyran dyes, phthalocyanine dyes, indigo dyes, flugide dyes, nickel complex dyes and azulene dyes. Concretely, the dyes include the following ones in term of color index number: C.

I. Solvent Yellow 2, 3, 7, 12, 13, 14, 16, 18, 19, 21, 25, 25:1, 27, 28, 29, 30, 33, 34, 36, 42, 43, 44, 47, 56, 62, 72, 73, 77, 79, 81, 82, 83, 83:1, 88, 89, 90, 93, 94, 96, 98, 104, 107, 114, 116, 117, 124, 130, 131, 133, 135, 141, 143, 145, 146, 157, 160:1, 161, 162, 163, 167, 169, 172, 174, 175, 176, 179, 180, 181, 182, 183, 184, 185, 186, 187, 189, 190, 191, C. I. Solvent Orange 1, 2, 3, 4, 5, 7, 11, 14, 20, 23, 25, 31, 40:1, 41, 45, 54, 56, 58, 60, 62, 63, 70, 75, 77, 80, 81, 86, 99, 102, 103, 105, 106, 107, 108, 109, 110, 111, 112, 113, C. I. Solvent Red 1, 2, 3, 4, 8, 16, 17, 18, 19, 23, 24, 25, 26, 27, 30, 33, 35, 41, 43, 45, 48, 49, 52, 68, 69, 72, 73, 83:1, 84:1, 89, 90, 90:1, 91, 92, 106, 109, 110, 118, 119, 122, 124, 125, 127, 130, 132, 135, 141, 143, 145, 146, 149, 150, 151, 155, 160, 161, 164, 164:1, 165, 166, 168, 169, 172, 175, 179, 180, 181, 182, 195, 196, 197, 198, 207, 208, 210, 212, 214, 215, 218, 222, 223, 225, 227, 229, 230, 233, 234, 235, 236, 238, 239, 240, 241, 242, 243, 244, 245, 247, 248, C. I. Solvent Violet 2, 8, 9, 11, 13, 14, 21, 21:1, 26, 31, 36, 37, 38, 45, 46, 47, 48, 49, 50, 51, 55, 56, 57, 58, 59, 60, 61, C. I. Solvent Blue 2, 3, 4, 5, 7, 18, 25, 26, 35, 36, 37, 38, 43, 44, 45, 48, 51, 58, 59, 59:1, 63, 64, 67, 68, 69, 70, 78, 79, 83, 94, 97, 98, 100, 101, 102, 104, 105, 111, 112, 122, 124, 128, 129, 132, 136, 137, 138, 139, 143, C. I. Solvent Green 1, 3, 4, 5, 7, 28, 29, 32, 33, 34, 35, C. I. Solvent Brown 1, 3, 4, 5, 12, 20, 22, 28, 38, 41, 42, 43, 44, 52, 53, 59, 60, 61, 62, 63, C. I. Solvent Black 3, 5, 5:2, 7, 13, 22, 22:1, 26, 27, 28, 29, 34, 35, 43, 45, 46, 48, 49, 50, C. I. Acid Red 6, 11, 26, 60, 88, 111, 186, 215, C. I. Acid Green 25, 27, C. I. Acid Blue 22, 25, 40, 78, 92, 113, 129, 167, 230, C. I. Acid Yellow 17, 23, 25, 36, 38, 42, 44, 72, 78, C. I. Basic Red 1, 2, 13, 14, 22, 27, 29, 39, C. I. Basic Green 3, 4, C. I. Basic Blue 3, 9, 41, 66, C. I. Basic Violet 1, 3, 18, 39, 66, C. I. Basic Yellow 11, 23, 25, 28, 41, C. I. Direct Red 4, 23, 31, 75, 76, 79, 80, 81, 83, 84, 149, 224, C. I. Direct Green 26, 28, C. I. Direct Blue 71, 78, 98, 106, 108, 192, 201, C. I. Direct Violet 51, C. I. Direct Yellow 26, 27, 28, 33, 44, 50, 86, 142, C. I. Direct Orange 26, 29, 34, 37, 72, C. I. Sulphur Red 5, 6, 7, C. I. Sulphur Green 2, 3, 6, C. I. Sulphur Blue 2, 3, 7, 9, 13, 15, C. I. Sulphur Violet 2, 3, 4, C. I. Sulphur Yellow 4, C. I. Vat Red 13, 21, 23, 28, 29, 48, C. I. Vat Green 3, 5, 8, C. I. Vat Blue 6, 14, 26, 30, C. I. Vat Violet 1, 3, 9, 13, 15, 16, C. I. Vat Yellow 2, 12, 20, 33, C. I. Vat Orange 2, 5, 11, 15, 18, 20, C. I. Azoic Coupling Component 2, 3, 4, 5, 7, 8, 9, 10, 11, 13, 32, 37, 41, 48, C. I. Reactive Red 8, 22, 46, 120, C. I. Reactive Blue 1, 2, 7, 19, C. I. Reactive Violet 2, 4, C. I. Reactive Yellow 1, 2, 4, 14, 16, C. I. Reactive Orange 1, 4, 7, 13, 16, 20, C. I. Disperse Red 4, 11, 54, 55, 58, 65, 73, 127, 129, 141, 196, 210, 229, 354, 356, C. I. Disperse Blue 3, 24, 79, 82, 87, 106, 125, 165, 183, C. I. Disperse Violet 1, 6, 12, 26, 27, 28, C. I. Disperse Yellow 3, 4, 5, 7, 23, 33, 42, 60, 64, C. I. Disperse Orange 13, 29, 30. These dyes may be used alone or in a combination of two or more in order to realize a development of a prescribed emission spectrum.

In the dye-containing negative type resist composition, the amount of dye (e) to be introduced is selected from a range of 1 to 90% by weight based on total solid content (100% by weight) of resin (a-1), photoacid generator or photobase generator (b-1), crosslinking compound (c-1) and dye (d). When the dye is introduced in a small amount, it becomes difficult to realize a desirable development of emission spectrum when resist coating is formed in a shape of thin film. On the other hand, when the dye is introduced in a large amount, the resist composition has a low shelf stability. However, because the negative type resist composition of the present invention uses ketol solvent (e), the dye can be introduced in as low concentration as some a few % by weight (dye concentration in solid content), and further a good solubility of the dye can be fully secured even when it is introduced in as high concentration as 30 to 90% by weight.

Similarly in the dye containing negative type resist composition comprising resin (a-2), photoradical generator (b-2), crosslinking compound (c-2) and dye (d), the amount of dye (e) to be introduced is selected from a range of 1 to 90% by weight based on total solid content (100% by weight) of the above-mentioned components. When the dye is introduced in a small amount, it becomes difficult to realize a desirable development of emission spectrum when resist coating is formed in a shape of thin film. On the other hand, when the dye is introduced in a large amount, the resist composition has a low shelf stability. However, because the negative type resist composition of the present invention uses ketol solvent (e), the dye can be introduced in as low concentration as some a few % by weight (dye concentration in solid content), and further a good solubility of the dye can be fully secured even when it is introduced in as high concentration as 30 to 90% by weight.

Further, in the dye containing positive type resist composition, the amount of dye (e) to be introduced is selected from a range of 1 to 90% by weight based on total solid content (100% by weight) of resin (a-3), photoacid generator (b-3), crosslinking compound (c-3) and dye (d). When the dye is introduced in a small amount, it becomes difficult to realize a desirable development of emission spectrum when resist coating is formed in a shape of thin film. On the other hand, when the dye is introduced in a large amount, the resist composition has a low shelf stability. However, because the positive type resist composition of the present invention uses ketol solvent (e), the dye can be introduced in as low concentration as some a few % by weight (dye concentration in solid content), and further a good solubility of the dye can be fully secured even when it is introduced in as high concentration as 30 to 90% by weight.

Solvents (e) used in the negative type or positive type resist composition are ketol solvents. Among them, β-hydroxyketones are preferable, and β-hydroxyketones include 4-hydroxy-4-methyl-2-pentanone, 4-hydroxy-4-methyl-2-hexanone, 4-hydroxy-4-ethyl-2-hexanone, 4-hydroxy-4-methyl-2-heptanone, 4-hydroxy-4-ethyl-2-heptanone, 4-hydroxy-4-propyl-2-heptanone, 2-methyl-2-hydroxy-4-hexanone, 2-methyl-2-hydroxy-4-pentanone, 2,3-dimethyl-3-hydroxy-5-hexanone and 2,6-dimethyl-2-hydroxy-4-heptanone, etc.

Among them, 4-hydroxy-4-methyl-2-pentanone is most preferable from the standpoint of the solubility of dye and availability.

Ketol solvents in the present invention is ketol, preferably β-hydroxyketone, more preferably 4-hydroxy-4-methyl-2-pentanone (diacetone alcohol) which is basically used alone, but can be used in a mixture of the ketol with other solvent. In order to increase the solubility of dye and the compatiblity with a resin, the amount of ketol, preferably β-hydroxyketones, more preferably 4-hydroxy-4-methyl-2-pentanone to be introduced is 1 to 100% by weight, preferably 10 to 100% by weight based on 100% by weight of the total solvent.

The other solvents to be mixed with ketol include for example acetone, methanol, ethanol, isopropylalcohol, methoxymethyl pentanol, dipentene, ethyl amyl ketone, methyl nonyl ketone, methyl ethyl ketone, methyl isoamyl ketone, methyl isopropyl ketone, methyl cellosove, ethyl cellosolve, methyl cellosolve acetate, ethyl cellosolve acetate, butyl carbitol, ethyl carbitol, ethylene glycol, ethylene glycol monoacetate, ethylene glycol monoisopropyl ether, ethylene glycol monobutyl ether, propylene glycol, propylene glycol monoacetate, propylene glycol monomethyl ether, propylene glycol-tert-butyl ether, dipropylene glycol monomethyl ether, diethylene glycol, diethylene glycol monoacetate, diethylene glycol dimethyl ether, dipropylene glycol monoacetate monomethyl ether, dipropylene glycol monomethyl ether, dipropylene glycol monoethyl ether, dipropylene glycol monoacetate monoethyl ether, dipropylene glycol monopropyl ether, dipropylene glycol monoacetate monopropyl ether, dipropylene glycol monopropyl ether, dipropylene glycol monoacetate monopropyl ether, 3-methyl-3-methoxybutyl acetate, tripropylene glycol methyl ether, 3-methyl-3-methoxybutanol, diisoproyl ether, ethyl isobutyl ether, disobutylene, amyl acetate, butyl butyrate, butyl ether, diisobutyl ketone, methyl cyclohexene, propyl ether, dihexyl ether, dioxane, N,N-dimethyl acetamide, N,N-dimethylformamide, dimethyl sulfoxide, N-metylpyrrolidone, γ-butyrolactone, n-hexane, n-pentane, n-octane, diethyl ether, cyclohexanone, methyl lactate, ethyl lacate, methyl acetate, ethyl acetate, n-butyl acetate, propylene glycol monoethyl ether acetate, methyl pyruvate, ethyl pyruvate, 3-methoxy methyl propionate, 3-ethoxy methyl ethyl propionate, 3-methoxy ethyl propionate, 3-ethoxy propionate, 3-methoxy propionate, 3-methoxy propyl propionate, 3-methoxy butyl propionate, diglyme, and the like. These solvents may be used alone or a combination of two or more.

In the dye-containing negative type or positive type resist composition, the content proportion of resin (a-1, a-2 or a-3), photoinitiator (b-1, b-2 or b-3), crosslinking compound (c-1, c-2 or c-3) and dye (d), that is, the solid content concentration is 5 to 50% by weight, preferably 10 to 30% by weight.

When the proportion is less than 5% by weight, the thickness of coating becomes too small to cause a problem of occurrence of pinholes. On the other hand, when it is more than 50% by weight, the viscosity of the resist composition becomes too high to give rise to lack of uniformity in thickness of coating.

The dye-containing negative type resist composition and dye-containing positive type resist composition of the present invention can contain surfactants in order to increase coatability of resist coating and surface evenness. As the surfactants, mention may be made of fluorine surfactants, silicone surfactants, nonionic surfactants and the like.

More concretely, the surfactants include for example EFTOP EF301, EF303 or EF352 (Tochem Products Co., Ltd.), MEGAFAC F171, F173 or R-30 (Dainippon Ink and Chemicals, Inc.), FLUORAD FC430 or FC431 (Sumitomo 3M Limited), ASAHI GUARD AG710, SURFLON S-382, SC101, SC102, SC103, SC104, SC105 or SC106 (Asahi Glass Co., Ltd.), etc.

The used proportion of the surfactants is preferably 0.01 to 2 parts by weight, more preferably 0.01 to 1 part by weight on the basis of 100 parts by weight of resin component. When the content of the surfactants is more than 2 parts by weight, the composition is liable to cause uneven resist coating. On the other hand, when the content is less than 0.01 part by weight, it is liable to cause striation in the resist coating.

In addition, in order to increase adhesion with a substrate after development, adhesion accelerators can be added. Concrete examples of the adhesion accelerators are for example chlorosilanes such as trimethylchlorosilane, dimethylvinylchlorosilane, methyldiphenylchlorosilane or chloromethyldimethylchlorosilane; alkoxysilanes such as trimethylmethoxysilane, dimethyldiethoxysilane, methyldimethoxysilane, dimethylvinylethoxysilane, diphenyldimethoxysilane or phenyltriethoxysilane; silazanes such as hexamethyldisilazane, N,N'-bis(trimethylsilyl)urea, dimethyltrimethylsilylamine or trimethylsilylimidazole; silanes such as vinyltrichlorosilane, γ-chloropropyltrimethoxysilane, γ-aminopropyltriethoxysilane, γ-methacryloxy propyl trimethoxy silane, or γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracyl, mercaptoimidazole or mercaptopyrimidine; ureas such as 1,1-dimethylene urea or 1,3-dimethylurea, or thiourea compounds.

The used proportion of the adhesion accelerators is generally 20 parts by weight or less, preferably 0.05 to 10 parts by weight, more preferably 1 to 10 parts by weight based on 100 parts by weight of the resin component.

The dye containing negative type and positive type resist compositions of the present invention can contain further additives which have miscibility with the resist composition. The additives include for example UV light absorbers for increasing light resistance, antioxidants, or compatibilizing agents for inhibiting deposition of dyes. Concrete examples of compatibilizing agents for inhibiting deposition of dyes are alkyl ether compounds such as polyoxyethylene octyl ether compounds, polyoxyethylene lauryl ether compounds, polyoxyethylene alkyl (12-13 carbon atoms) ether compounds, polyoxyethylene secondary alkyl (12-14 carbon atoms) ether compounds, polyoxyethylene alkyl (13 carbon atoms) ether compounds, polyoxyethylene cetyl ether compounds, polyoxyethylene stearyl ether compounds, polyoxyethylene oleyl ether compounds, polyoxyethylene decyl ether compounds, polyoxyalkylene alkyl (11-15 carbon atoms) ether compounds, polyoxyalkylene secondary alkyl (12-14 carbon atoms) ether compounds or polyoxyalkylene cetyl ether compounds, alkyl amino ether compounds such as polyoxyethylene lauryl amino ether compounds or polyoxyethylene stearyl amino ether compounds, alkyl amido ether compounds such as polyoxyethylene lauric amide ether compounds, polyoxyethylene stearic amide ether compounds, polyoxyethylene oleic amide ether compounds, lauric diethanol amido compounds, stearic diethanol amido compounds or oleic diethanol amido compounds, allyl phenyl ether compounds such as polyoxyethylene polystyrphenyl ether compounds, polyoxyalkylene polystyrphenyl ether compounds, polyoxyalkylene polystyrphenyl ether formamide condensates, polyoxyethylene monostyryl phenyl ether compounds, polyoxyethylene distyryl phenyl ether compounds or polyoxyethylene naphthyl ether compounds, glycerin fatty acid ester compounds such as glycerin monolaurate compounds, glycerin monostearate compounds, glycerin monooleate compounds or glycerin trioleate compounds, sorbitan acid ester compounds such as sorbitan monolaurate compounds, sorbitan monopalmitate compounds, sorbitasn monostearate compounds, sorbitan tristearate compounds, sorbitan monooleate compounds or sorbitan trioleate compounds, fatty acid ether ester compounds such as polyoxyethylene dilaurate compounds, polyoxyethylene laurate compounds, polyoxyethylene stearate compounds, polyoxyethylene distearate compounds, polyoxyethylene dioleate compounds or polyoxyethylene oleate compounds, vegetable oil ether ester compounds such as polyoxyethylene castor oil ether compounds or polyoxyethylene hardened castor oil ether compounds, sorbitan ether ester compounds such as polyoxyethylene sorbitan monolaurate compounds, polyoxyethylene sorbitan monostearate compounds, polyoxyethylene sorbitan monooleate compounds or polyoxyethylene sorbitan trioleate compounds, monool type polyether compounds such as polyoxyalkylene butyl ether compounds, polyoxyalkylene octyl ether compounds, polyoxyalkylene alkyl (14-15 carbon atoms) ether compounds or polyoxyalkylene oleyl ether compounds, diol type polyether compounds such as polyoxyethylene polyoxypropylene condensates, polyol type polyether compounds such as trimethylol propane tris(polyoxyalkylene)ether compounds or polyoxyalkylene glyceryl ether compounds, fatty acid alkyl ester compounds such as methyl laurate compounds, methyl oleate compounds, isopropyl myristate compounds, butyl stearate compounds, octyl palmitate compounds, octyl stearate compounds, lauryl oleate compounds, isotridecyl stearate compounds, oleyl oleate compounds, dioleyl adipate compounds, trimethylol propane tridecanoate compounds, trimethylol propane trilaurate compounds, pentaerythritol dioleate compounds, pentaerythritol monostearate compounds or pentaerythritol distearate compounds, sulfonic acid type compounds, alkylsulfonate compounds, long-chain alkylbenzene sulfonic acid compounds, branched alkylbenzene sulfonic acid compounds, long-chain alkylbenzene sulfonate compounds, branched alkylbenzene sulfonate compounds, branched alkyldiphenyl ether disulfonate compounds, monoisopropyl naphthalene sulfonate compounds, diisopropyl naphthalene sulfonate compounds, triisopropyl naphthalene sulfonate compounds, dibutyl naphthalene sulfonate compounds or dioctyl sulfosuccinate compounds, sulfate type compounds such as oleic acid sulfated oil compounds, castor oil sulfated compounds, octyl sulfate compounds, lauryl sulfate compounds, alkyl sulfate compounds or alkyl ether sulfate compounds, cellulose, cellulose derivatives, polysaccharide compounds and the like.

The used proportion of these compatibilizing agents is 0.001 to 20 parts by weight based on 100 parts by weight of resin component. When the proportion is low, the resulting composition is inferior in a property of inhibiting deposition of dye to one containing it in a high proportion. When the proportion is high, it becomes difficult to obtain a good pattern shape. However, the compatibilizing agent can be used in an amount of 20 parts by weight or more so long as it does not inhibit a pattern shape.

Next, methods of producing color filters by using the dye-containing negative type resist composition and positive type resist composition for color filter according to the present invention are described.

The dye-containing negative type resist composition or positive type resist composition of the present invention is coated on a silicon wafer or a glass substrate by spin-coating method or the like in a number of revolution so as to a desired resist thickness, and soft-baked (calcined). In the soft-baking, it is necessary to vaporize the solvent, and it is preferably carried out at a temperature of 50 to 150° C. for 30 seconds to 10 minutes. Thereafter, exposure is carried out through a mask in an exposure of about 100 to 2,000 mJ/cm$^2$. For the exposure, UV light such as mercury vapor lamp, far UV light, electron rays, X-rays and the like are used for example. After exposure, when a negative type pattern is formed by using the dye-containing negative type resist composition, heating (post exposure bake (PEB)) is preferably performed. By performing PEB, crosslinking by an acid or base generated with exposure further proceeds, and difference of solubility in developer between an exposed part and an unexposed part becomes larger, thereby a contrast is increased. PEB is preferably performed at a temperature of 50 to 150° C. for 30 seconds to 5 minutes.

Subsequently, developing is performed. Methods of developing are not specifically limited, and well known methods such as paddle method, dip method, spray method and the like can be used. It is preferable that the temperature for developing ranges from 20° C. to 30° C. and that the time of dipping in developer is 10 seconds to 10 minutes.

As developer, organic solvents or alkaline aqueous solutions, etc. can be used. Concretely, the developer includes isopropyl alcohol, propylene glycol monomethyl ether, an aqueous solution of ethyl amine, an aqueous solution of n-propylamine, an aqueous solution of diethylamine, an aqueous solution of di-n-propylamine, an aqueous solution of triethylamine, an aqueous solution of methyldiethylamine, an aqueous solution of diethanol amine, an aqueous solution of triethanol amine, an aqueous solution of tetramethyl ammonium hydroxide, an aqueous solution of sodium hydroxide, an aqueous solution of potassium hydroxide, an aqueous solution of sodium carbonate, an aqueous solution of sodium bicarbonate, an aqueous solution of sodium silicate or an aqueous solution of sodium metasilicate, etc.

In order to increase a performance of removing unexposed parts, it is preferable to add surfactants. Concrete examples thereof are alkyl ether compounds such as polyoxyethylene octyl ether compounds, polyoxyethylene lauryl ether compounds, polyoxyethylene alkyl (12-13 carbon atoms) ether compounds, polyoxyethylene secondary alkyl (12-14 carbon atoms) ether compounds, polyoxyethylene alkyl (13 carbon atoms) ether compounds, polyoxyethylene cetyl ether compounds, polyoxyethylene stearyl ether compounds, polyoxyethylene oleyl ether compounds, polyoxyethylene decyl ether compounds, polyoxyalkylene alkyl (11-15 carbon atoms) ether compounds, polyoxyalkylene secondary alkyl (12-14 carbon atoms) ether compounds or polyoxyalkylene cetyl ether compounds, alkyl amino ether compounds such as polyoxyethylene lauryl amino ether compounds or polyoxyethylene stearyl amino ether compounds, alkyl amido ether compounds such as polyoxyethylene lauric amide ether compounds, polyoxyethylene stearic amide ether compounds, polyoxyethylene oleic amide ether compounds, lauric diethanol amido compounds, stearic diethanol amido compounds or oleic diethanol amido compounds, allyl phenyl ether compounds such as polyoxyethylene polystyrphenyl ether compounds, polyoxyalkylene polystyrphenyl ether compounds, polyoxyalkylene polystyrphenyl ether formamide condensates, polyoxyethylene monostyryl phenyl ether compounds, polyoxyethylene distyryl phenyl ether compounds or polyoxyethylene naphthyl ether compounds, glycerin fatty acid ester compounds such as glycerin monolaurate compounds, glycerin monostearate compounds, glycerin monooleate compounds or glycerin trioleate compounds, sorbitan acid ester compounds such as sorbitan monolaurate compounds, sorbitan monopalmitate compounds, sorbitasn monostearate compounds, sorbitan tristearate compounds, sorbitan monooleate compounds or sorbitan trioleate compounds, fatty acid ether ester compounds such as polyoxyethylene dilaurate compounds, polyoxyethylene laurate compounds, polyoxyethylene stearate compounds, polyoxyethylene distearate compounds, polyoxyethylene dioleate compounds or polyoxyethylene oleate compounds, vegetable oil ether ester compounds such as polyoxyethylene castor oil ether compounds or polyoxyethylene hardened castor oil ether compounds, sorbitan ether ester compounds such as polyoxyethylene sorbitan monolaurate compounds, polyoxyethylene sorbitan monostearate compounds, polyoxyethylene sorbitan monooleate compounds or polyoxyethylene sorbitan trioleate compounds, mono-ol type polyether compounds such as polyoxyalkylene butyl ether compounds, polyoxyalkylene octyl ether compounds, polyoxyalkylene alkyl (14-15 carbon atoms) ether compounds or polyoxyalkylene oleyl ether compounds, diol type polyether compounds such as polyoxyethylene polyoxypropylene condensates, polyol type polyether compounds such as trimethylol propane tris(polyoxyalkylene)ether compounds or polyoxyalkylene glyceryl ether compounds, fatty acid alkyl ester compounds such as methyl laurate compounds, methyl oleate compounds, isopropyl myristate compounds, butyl stearate compounds, octyl palmitate compounds, octyl stearate compounds, lauryl oleate compounds, isotridecyl stearate compounds, oleyl oleate compounds, dioleyl adipate compounds, trimethylol propane tridecanoate compounds, trimethylol propane trilaurate compounds, pentaerythritol dioleate compounds, pentaerythritol monostearate compounds or pentaerythritol distearate compounds, sulfonic acid type compounds such as alkylsulfonate compounds, long-chain alkylbenzene sulfonic acid compounds, branched alkylbenzene sulfonic acid compounds, long-chain alkylbenzene sulfonate compounds, branched alkylbenzene sulfonate compounds, branched alkyldiphenyl ether disulfonate compounds, monoisopropyl naphthalene sulfonate compounds, diisopropyl naphthalene sulfonate compounds, triisopropyl naphthalene sulfonate compounds, dibutyl naphthalene sulfonate compounds or dioctyl sulfosuccinate compounds, sulfate type compounds such as oleic acid sulfated oil compounds, castor oil sulfated compounds, octyl sulfate compounds, lauryl sulfate compounds, alkyl sulfate compounds or alkyl ether sulfate compounds, and the like. The preferable concentration of the alkaline developer is 0.001 to 10% by weight of the alkaline component and 0.001 to 10% by weight of the surfactant component. When the concentration of the alkaline component is too high, the developer permeates into even unexposed parts in the negative type or exposed parts in the positive type, thereby causing unevenness of pattern surface. On the other hand, the developer having too law concentration of the alkaline component does not exhibit developing capacity. Further, when the concentration of the surfactant component is too high, the developer is apt to occur bubbling and to cause uneven development. On the other hand, the developer having too law concentration of the surfactant component does not exhibit developing capacity.

After developing, it is preferable to rinse with water or conventional organic solvents. Thereafter, a pattern is formed by drying. In case where the dye-containing negative type resist composition is used, exposed parts are hardened and unexposed parts are dissolved out to form a negative pattern. On the other hand, in case where the dye-containing positive type resist composition is used, exposed parts are dissolved out to form a positive pattern.

A sequence of the above-mentioned processes is repeated necessary times by changing color and mask to form colored pattern in which necessary colors are combined. In addition, after forming a pattern, heat (post bake) may be performed in order to subject functional groups that remain in the pattern and can be polymerized or condensed to complete reaction. The post bake may be performed for each process for forming each color or after the completion of forming all colored patterns. It is preferably performed at a temperature ranging from 150 to 500° C. for 30 minutes to 2 hours.

EXAMPLES

Preparation of Dye-Containing Negative Type Resist Composition
Novolak resin: Phenol novolak resin A (number average molecular weight 9,000 in term of polystyrene) obtained by condensing phenol with formaldehyde;
Polyhydroxystyrene resin: VP 8000 (manufactured by Nippon Soda Co., Ltd.);
Polyhydroxystyrene copolymer: Maruka Lyncur CHM (copolymer of p-vinylphenol with 2-hydroxyethyl methacrylate in a molar ratio of 1:1) (manufactured by Maruzen Petrochemical Co., Ltd.);
Acrylic resin: Acrylic resin A (a solution of copolymer of (meth)acrylic acid, hydroxyethyl(meth)acrylate and methyl(meth)acrylate in a molar ratio of 9:25.5:65.5 in propylene glycol monomethyl ether acetate, concentration of solid content: 22.0% by weight, weight average molecular weight: 6,000 (in term of polystyrene)).

Example 1

In a 50 ml eggplant type flask, 1.76 g of phenol novolak resin A as novolak resin, 1.10 g of Valifast Red 1355 (manufactured by Orient Chemical Co., Ltd.) as red dye, and 9.43 g of 4-hydroxy-4-methyl-2-pentanone as solvent were charged and stirred at room temperature. The reaction solution contained no insoluble matter and was a homogeneous solution. Thereafter, 0.18 g of methoxy methylated melamine crosslinking compound (trade name: Cymel 303, manufactured by Mitsui Cytec Co., Ltd.) as crosslinking compound, 0.09 g of triazine photoacid generator (trade name: TAZ-108, manufactured by Midori Kagaku Co., Ltd.) as photoacid generator, and 0.009 g of fluorine surfactant (trade name: Megafac R-30, manufactured by Dainippon Ink and Chemicals, Inc.) were added, and further stirred at room temperature to obtain dye-containing negative type resist composition (1). The resulting solution contained no insoluble matter and was a homogeneous solution. A part of the resulting dye-containing negative type resist composition (1) was filtered through a 0.2 µm filter, and the resulting filtrate was charged in a washed vial and left at room temperature for one week. As a result of it, no foreign matter (particle) was observed by a visual evaluation.

Example 2

In a 50 ml eggplant type flask, 1.76 g of phenol novolak resin A as novolak resin, 1.10 g of Valifast Red 1355 as red dye, and 9.43 g of 4-hydroxy-4-methyl-2-pentanone as solvent were charged and stirred at room temperature. The reaction solution contained no insoluble matter and was a homogeneous solution. Thereafter, 0.35 g of butoxy methylated glycoluril crosslinking compound (trade name: Cymel 1170, manufactured by Mitsui Cytec Co., Ltd.) as crosslinking compound, 0.18 g of sulfonate photoacid generator (trade name: NAI-105, manufactured by Midori Kagaku Co., Ltd.) as photoacid generator, and 0.012 g of fluorine surfactant (trade name: Megafac R-30) were added, and further stirred at room temperature to obtain dye-containing negative type resist composition (2). The resulting solution contained no insoluble matter and was a homogeneous solution. A part of the resulting dye-containing negative type resist composition (2) was filtered through a 0.2 µm filter, and the resulting filtrate was charged in a washed vial and left at room temperature for one week. As a result of it, no foreign matter (particle) was observed by a visual evaluation.

Example 3

In a 50 ml eggplant type flask, 1.76 g of phenol novolak resin A as novolak resin, 1.10 g of Valifast Red 1355 as red dye, and 9.43 g of 4-hydroxy-4-methyl-2-pentanone as solvent were charged and stirred at room temperature. The reaction solution contained no insoluble matter and was a homogeneous solution. Thereafter, 0.25 g of epoxy crosslinking compound (trade name: GT-401, manufactured by Daicel Chemical Industries Ltd.) as crosslinking compound, 0.12 g of sulfonium salt type photoacid generator (trade name: DTS-105, manufactured by Midori Kagaku Co., Ltd.) as photoacid generator, and 0.010 g of fluorine surfactant (trade name: Megafac R-30) were added, and further stirred at room temperature to obtain dye-containing negative type resist composition (3). The resulting solution contained no insoluble matter and was a homogeneous solution. A part of the resulting dye-containing negative type resist composition (3) was filtered through a 0.2 μm filter, and the resulting filtrate was charged in a washed vial and left at room temperature for one week. As a result of it, no foreign matter (particle) was observed by a visual evaluation.

Example 4

In a 50 ml eggplant type flask, 1.00 g of phenol novolak resin A as novolak resin, 2.00 g of Valifast Red 1355 as red dye, and as solvent 4.14 g of 4-hydroxy-4-methyl-2-pentanone and 6.12 g of propylene glycol monomethyl ether were charged and stirred at room temperature. The reaction solution contained no insoluble matter and was a homogeneous solution. Thereafter, 0.30 g of methoxy methylated melamine crosslinking compound (trade name: Cymel 303) as crosslinking compound, 0.15 g of triazine photoacid generator (trade name: TAZ-107, manufactured by Midori Kagaku Co., Ltd.) as photoacid generator, and 0.009 g of fluorine surfactant (trade name: Megafac R-30) were added, and further stirred at room temperature to obtain dye-containing negative type resist composition (4). The resulting solution contained no insoluble matter and was a homogeneous solution. A part of the resulting dye-containing negative type resist composition (4) was filtered through a 0.2 μm filter, and the resulting filtrate was charged in a washed vial and left at room temperature for one week. As a result of it, no foreign matter (particle) was observed by a visual evaluation.

Example 5

In a 50 ml eggplant type flask, 1.00 g of phenol novolak resin A as novolak resin, 2.00 g of Valifast Red 1355 as red dye, and as solvent 3.11 g of 4-hydroxy-4-methyl-2-pentanone and 7.25 g of ethyl lactate were charged and stirred at room temperature. The reaction solution contained no insoluble matter and was a homogeneous solution. Thereafter, 0.15 g of methoxy methylated melamine crosslinking compound (trade name: Cymel 303) as crosslinking compound, 0.07 g of triazine photoacid generator (trade name: TAZ-108) as photoacid generator, and 0.009 g of fluorine surfactant (trade name: Megafac R-30) were added, and further stirred at room temperature to obtain dye-containing negative type resist composition (5). The resulting solution contained no insoluble matter and was a homogeneous solution. A part of the resulting dye-containing negative type resist composition (5) was filtered through a 0.2 μm filter, and the resulting filtrate was charged in a washed vial and left at room temperature for one week. As a result of it, no foreign matter (particle) was observed by a visual evaluation.

Example 6

In a 100 ml eggplant type flask, 7.07 g of acrylic resin A as acrylic resin, 0.27 g of Red GS (manufactured by Nissei Kasel Co., Ltd.) as red dye, and 36.80 g of 4-hydroxy-4-methyl-2-pentanone as solvent were charged and stirred at room temperature. The reaction solution contained no insoluble matter and was a homogeneous solution. Thereafter, 3.31 g of a crosslinking compound (trade name: KAYARADDPHA-40H, manufactured by Nippon Kayaku Co., Ltd.), 0.30 g of a photoradical generator (trade name: 1-369, manufactured by Ciba Specialty Chemicals), 0.20 g of a photosensitizer (trade name: ITX, manufactured by First Chemical Corporation) and 0.015 g of fluorine surfactant (trade name: Megafac R-30) were added, and further stirred at room temperature to obtain dye-containing negative type resist composition (6). The resulting solution contained no insoluble matter and was a homogeneous solution. A part of the resulting dye-containing negative type resist composition (6) was filtered through a 0.2 μm filter, and the resulting filtrate was charged in a washed vial and left at room temperature for one week. As a result of it, no foreign matter (particle) was observed by a visual evaluation.

Example 7

In a 50 ml eggplant type flask, 1.00 g of phenol novolak resin A as novolak resin, 2.00 g of Savinyl Fire Red GLS (manufactured by Clariant AG) as red dye, and 10.35 g of 4-hydroxy-4-methyl-2-pentanone as solvent were charged and stirred at room temperature. The reaction solution contained no insoluble matter and was a homogeneous solution. Thereafter, 0.30 g of methoxy methylated melamine crosslinking compound (trade name: Cymel 303) as crosslinking compound, 0.15 g of triazine photoacid generator (trade name: TAZ-107) as photoacid generator, and 0.009 g of fluorine surfactant (trade name: Megafac R-30) were added, and further stirred at room temperature to obtain dye-containing negative type composition (7). The resulting solution contained no insoluble matter and was a homogeneous solution. A part of the resulting dye-containing negative type resist composition (7) was filtered through a 0.2 μm filter, and the resulting filtrate was charged in a washed vial and left at room temperature for one week. As a result of it, no foreign matter (particle) was observed by a visual evaluation.

Example 8

In a 50 ml eggplant type flask, 1.00 g of phenol novolak resin A as novolak resin, 5.80 g of Savinyl Fire Red GLS as red dye, and 13.51 g of 4-hydroxy-4-methyl-2-pentanone as solvent were charged and stirred at room temperature. The reaction solution contained no insoluble matter and was a homogeneous solution. Thereafter, 0.40 g of methoxy methylated melamine crosslinking compound (trade name: Cymel 303) as crosslinking compound, 0.18 g of triazine photoacid generator (trade name: TAZ-108) as photoacid generator, and 0.01 g of fluorine surfactant (trade name: Megafac R-30) were added, and further stirred at room temperature to obtain dye-containing negative type resist composition (8). The resulting solution contained no insoluble matter and was a homogeneous solution. A part of the resulting dye-containing negative type resist composition (8) was filtered through a 0.2 μm filter, and the resulting filtrate was charged in a washed vial and left at room temperature for one week. As a result of it, no foreign matter (particle) was observed by a visual evaluation.

Example 9

In a 50 ml eggplant type flask, 1.76 g of VP 8000 as polyhydroxy styrene, 1.10 g of Valifast Green 1501 (manufactured by Orient Chemical Co., Ltd.) as green dye, and 9.43 g of 4-hydroxy-4-methyl-2-pentanone as solvent were charged and stirred at room temperature. The reaction solution contained no insoluble matter and was a homogeneous solution. Thereafter, 0.18 g of methoxy methylated melamine crosslinking compound (trade name: Cymel 303) as crosslinking compound, 0.09 g of triazine photoacid generator (trade name: TAZ-108) as photoacid generator, and 0.009 g of fluorine surfactant (trade name: Megafac R-30) were added, and further stirred at room temperature to obtain dye-containing negative type resist composition (9). The resulting solution contained no insoluble matter and was a homogeneous solution. A part of the resulting dye-containing negative type resist composition (9) was filtered through a 0.2 µm filter, and the resulting filtrate was charged in a washed vial and left at room temperature for one week. As a result of it, no foreign matter (particle) was observed by a visual evaluation.

Example 10

In a 50 ml eggplant type flask, 1.00 g of VP 8000 as polyhydroxy styrene, 2.00 g of Valifast Green 1501 as green dye, and as solvent 4.14 g of 4-hydroxy-4-methyl-2-pentanone and 6.21 g of propylene glycol monomethyl ether acetate were charged and stirred at room temperature. The reaction solution contained no insoluble matter and was a homogeneous solution. Thereafter, 0.50 g of methoxy methylated melamine crosslinking compound (trade name: Cymel 303) as crosslinking compound, 0.25 g of triazine photoacid generator (trade name: TAZ-107) as photoacid generator, and 0.009 g of fluorine surfactant (trade name: Megafac R-30) were added, and further stirred at room temperature to obtain dye-containing negative type resist composition (10). The resulting solution contained no insoluble matter and was a homogeneous solution. A part of the resulting dye-containing negative type resist composition (10) was filtered through a 0.2 µm filter, and the resulting filtrate was charged in a washed vial and left at room temperature for one week. As a result of it, no foreign matter (particle) was observed by a visual evaluation.

Example 11

In a 50 ml eggplant type flask, 1.76 g of Maruka Lyncur CHM as polyhydroxy styrene copolymer, 1.10 g of Valifast Blue 1621 (manufactured by Orient Chemical Co., Ltd.) as blue dye, and 9.43 g of 4-hydroxy-4-methyl-2-pentanone as solvent were charged and stirred at room temperature. The reaction solution contained no insoluble matter and was a homogeneous solution. Thereafter, 0.18 g of methoxy methylated melamine crosslinking compound (trade name: Cymel 303) as crosslinking compound, 0.09 g of triazine photoacid generator (trade name: TAZ-108) as photoacid generator, and 0.009 g of fluorine surfactant (trade name: Megafac R-30) were added, and further stirred at room temperature to obtain dye-containing negative type resist composition (11). The resulting solution contained no insoluble matter and was a homogeneous solution. A part of the resulting dye-containing negative type resist composition (11) was filtered through a 0.2 µm filter, and the resulting filtrate was charged in a washed vial and left at room temperature for one week. As a result of it, no foreign matter (particle) was observed by a visual evaluation.

Example 12

In a 50 ml eggplant type flask, 1.00 g of Maruka Lyncur CHM as polyhydroxy styrene copolymer, 5.80 g of Valifast Blue 1621 as blue dye, and 13.51 g of 4-hydroxy-4-methyl-2-pentanone as solvent were charged and stirred at room temperature. The reaction solution contained no insoluble matter and was a homogeneous solution. Thereafter, 0.50 g of methoxy methylated melamine crosslinking compound (trade name: Cymel 303) as crosslinking compound, 0.20 g of triazine photoacid generator (trade name: TAZ-108) as photoacid generator, and 0.01 g of fluorine surfactant (trade name: Megafac R-30) were added, and further stirred at room temperature to obtain dye-containing negative type resist composition (12). The resulting solution contained no insoluble matter and was a homogeneous solution. A part of the resulting dye-containing negative type resist composition (12) was filtered through a 0.2 µm filter, and the resulting filtrate was charged in a washed vial and left at room temperature for one week. As a result of it, no foreign matter (particle) was observed by a visual evaluation.

Example 13

In a 50 ml eggplant type flask, 1.00 g of Maruka Lyncur CHM as polyhydroxy styrene copolymer, 2.00 g of Valifast Blue 2620 (manufactured by Orient Chemical Co., Ltd.) as blue dye, and 10.35 g of 4-hydroxy-4-methyl-2-pentanone as solvent were charged and stirred at room temperature. The reaction solution contained no insoluble matter and was a homogeneous solution. Thereafter, 0.30 g of methoxy methylated melamine crosslinking compound (trade name: Cymel 303) as crosslinking compound, 0.15 g of triazine photoacid generator (trade name: TAZ-108) as photoacid generator, and 0.012 g of fluorine surfactant (trade name: Megafac R-30) were added, and further stirred at room temperature to obtain dye-containing negative type resist composition (13). The resulting solution contained no insoluble matter and was a homogeneous solution. A part of the resulting dye-containing negative type resist composition (13) was filtered through a 0.2 µm filter, and the resulting filtrate was charged in a washed vial and left at room temperature for one week. As a result of it, no foreign matter (particle) was observed by a visual evaluation.

Example 14

In a 50 ml eggplant type flask, 1.00 g of Maruka Lyncur CHM as polyhydroxy styrene copolymer, 2.00 g of Valifast Blue 2620 as blue dye, and as solvent 4.14 g of 4-hydroxy-4-methyl-2-pentanone and 6.21 g of propylene glycol monomethyl ether were charged and stirred at room temperature. The reaction solution contained no insoluble matter and was a homogeneous solution. Thereafter, 0.30 g of methoxy methylated melamine crosslinking compound (trade name: Cymel 303) as crosslinking compound, 0.15 g of triazine photoacid generator (trade name: TAZ-107) as photoacid generator, and 0.009 g of fluorine surfactant (trade name: Megafac R-30) were added, and further stirred at room temperature to obtain dye-containing negative type resist composition (14). The resulting solution contained no insoluble matter and was a homogeneous solution. A part of the resulting dye-containing negative type resist composition (14) was filtered through a 0.2 µm filter, and the resulting filtrate was charged in a washed vial and left at room temperature for one week. As a result of it, no foreign matter (particle) was observed by a visual evaluation.

Comparative Example 1

In a 50 ml eggplant type flask, 1.76 g of phenol novolak resin A as novolak resin, 1.10 g of Valifast Red 1355 as red dye, and 9.43 g of propylene glycol monomethyl ether as solvent were charged and stirred at room temperature. The dyes were separated out in the reaction solution. Thereafter, 0.18 g of methoxy methylated melamine crosslinking compound (trade name: Cymel 303) as crosslinking compound, 0.09 g of triazine photoacid generator (trade name: TAZ-108) as photoacid generator, and 0.009 g of fluorine surfactant (trade name: Megafac R-30) were added, and further stirred at room temperature. However, the dyes were not dissolved and a homogeneous solution was not obtained. In addition, 0.54 g of dye was obtained by filtering out dye separated out in the resulting heterogeneous dye-containing negative type resist composition (15). Consequently, a dye-containing negative type resist composition having a prescribed dye concentration could not be obtained. Further, the heterogeneous dye-containing negative type resist composition (15) prepared by a similar process was filtered through a 0.2 μm filter, and the resulting filtrate was charged in a washed vial and left at room temperature. As a result of it, foreign matter (particle) was observed by a visual evaluation at the first day.

Comparative Example 2

In a 50 ml eggplant type flask, 1.76 g of VP 8000 as polyhydroxy styrene, 1.10 g of Valifast Green 1501 as green dye, and 9.43 g of propylene glycol monomethyl ether as solvent were charged and stirred at room temperature. The dyes were separated out in the reaction solution. Thereafter, 0.18 g of methoxy methylated melamine crosslinking compound (trade name: Cymel 303) as crosslinking compound, 0.09 g of triazine photoacid generator (trade name: TAZ-108) as photoacid generator, and 0.009 g of fluorine surfactant (trade name: Megafac R-30) were added, and further stirred at room temperature. However, the dyes were not dissolved and a homogeneous solution was not obtained. In addition, 0.46 g of dye was obtained by filtering out dye separated out in the resulting heterogeneous dye-containing negative type resist composition (16). Consequently, a dye-containing negative type resist composition having a prescribed dye concentration could not be obtained. Further, the heterogeneous dye-containing negative type resist composition (16) prepared by a similar process was filtered through a 0.2 μm filter, and the resulting filtrate was charged in a washed vial and left at room temperature. As a result of it, foreign matter (particle) was observed by a visual evaluation at the first day.

Comparative Example 3

In a 50 ml eggplant type flask, 1.76 g of Maruka Lyncur CHM as polyhydroxy styrene copolymer, 1.10 g of Valifast Blue 1621 as blue dye, and 9.43 g of ethyl lactate as solvent were charged and stirred at room temperature. The dyes were separated out in the reaction solution. Thereafter, 0.18 g of methoxy methylated melamine crosslinking compound (trade name: Cymel 303) as crosslinking compound, 0.09 g of triazine photoacid generator (trade name: TAZ-108) as photoacid generator, and 0.006 g of fluorine surfactant (trade name: Megafac R-30) were added, and further stirred at room temperature. However, the dyes were not dissolved and a homogeneous solution was not obtained. In addition, 0.55 g of dye was obtained by filtering out dye separated out in the resulting heterogeneous dye-containing negative type resist composition (17). Consequently, a dye-containing negative type resist composition having a prescribed dye concentration could not be obtained. Further, the heterogeneous dye-containing negative type resist composition (17) prepared by a similar process was filtered through a 0.2 μm filter, and the resulting filtrate was charged in a washed vial and left at room temperature. As a result of it, foreign matter (particle) was observed by a visual evaluation at the first day.

Comparative Example 4

In a 50 ml eggplant type flask, 1.76 g of Maruka Lyncur CHM as polyhydroxy styrene copolymer, 1.10 g of Valifast Blue 1621 as blue dye, and as solvent 4.72 g of propylene glycol monomethyl ether and 4.72 g of propylene glycol monomethyl ether acetate were charged and stirred at room temperature. The dyes were separated out in the reaction solution. Thereafter, 0.18 g of methoxy methylated melamine crosslinking compound (trade name: Cymel 303) as crosslinking compound, 0.09 g of triazine photoacid generator (trade name: TAZ-108) as photoacid generator, and 0.009 g of fluorine surfactant (trade name: Megafac R-30) were added, and further stirred at room temperature. However, the dyes were not dissolved and a homogeneous solution was not obtained. In addition, 0.65 g of dye was obtained by filtering out dye separated out in the resulting heterogeneous dye-containing negative type resist composition (18). Consequently, a dye-containing negative type resist composition having a prescribed dye concentration could not be obtained. Further, the heterogeneous dye-containing negative type resist composition (18) prepared by a similar process was filtered through a 0.2 μm filter, and the resulting filtrate was charged in a washed vial and left at room temperature. As a result of it, foreign matter (particle) was observed by a visual evaluation at the first day.

Preparation of Color Filter

All of silicon wafers used in Examples 15 to 28 and Comparative Examples 5 to 8 had same dimension. In the meanwhile, observations of the presence of foreign matter (particle) on pattern coatings formed on silicon wafer were performed by observing it at the position 30 cm apart from the surface of the silicon wafer under a sodium lamp in a dark room. When foreign matter (particle) was recognized, total number thereof was counted. Observations with optical microscope were performed with a magnification of 1,000 times, and the size of the foreign matter (particle) was measured in case where it was recognized.

Example 15

Dye-containing negative type resist composition (1) prepared in Example 1 was filtered through a 0.2 μm filter, and the resulting filtrate was charged in a washed vial and left at room temperature for two days. Thereafter, the composition was coated on a silicon wafer by means of a spin coater, soft-baked (calcined) at 100° C. for 1 minute on a hot plate to form a coating with film thickness 0.95 μm. The coating was irradiated through a test mask with UV light of an exposed dose of 300 mJ/cm$^2$ at 365 nm by use of UV light irradiation apparatus PLA-501 (F) manufactured by Cannon Inc. Then, post exposure bake (PEB) was performed at 120° C. for 1 minute. Thereafter, the PEB processed wafer was developed by immersing in NMD-3 developer (manufactured by Tokyo Ohka Kogyo Co., Ltd.) at 23° C. for at a given period, and was washed with flowing pure water. Then, a post bake was performed at 150° C. for 5 minutes on a hot plate to form a Red negative type pattern. The resolution of the pattern was as follows: pattern to 2 μm in term of line/space was formed without peeling. No foreign matter (particle) was recognized on the pattern coating formed on silicon wafer by visual evaluation under a sodium lamp. In addition, an observations with optical microscope did not detect foreign matter (particle).

Example 16

Dye-containing negative type resist composition (2) prepared in Example 2 was filtered through a 0.2 μm filter, and the resulting filtrate was charged in a washed vial and left at room temperature for two days. Thereafter, the composition was coated on a silicon wafer by means of a spin coater, soft-baked (calcined) at 100° C. for 1 minute on a hot plate to form a coating with film thickness 1.00 μm. The coating was irradiated through a test mask with UV light of an exposed dose of 300 mJ/cm² at 365 nm by use of UV light irradiation apparatus PLA-501 (F) manufactured by Cannon Inc. Then, post exposure bake (PEB) was performed at 120° C. for 1 minute. Thereafter, the PEB processed wafer was developed by immersing in NMD-3 developer (manufactured by Tokyo Ohka Kogyo Co., Ltd.) at 23° C. for at a given period, and was washed with flowing pure water. Then, a post bake was performed at 150° C. for 5 minutes on a hot plate to form a Red negative type pattern. The resolution of the pattern was as follows: pattern to 5 μm in term of line/space was formed without peeling. No foreign matter (particle) was recognized on the pattern coating formed on silicon wafer by visual evaluation under a sodium lamp. In addition, an observations with optical microscope did not detect foreign matter (particle).

Example 17

Dye-containing negative type resist composition (3) prepared in Example 3 was filtered through a 0.2 μm filter, and the resulting filtrate was charged in a washed vial and left at room temperature for two days. Thereafter, the composition was coated on a silicon wafer by means of a spin coater, soft-baked (calcined) at 100° C. for 1 minute on a hot plate to form a coating with film thickness 0.98 μm. The coating was irradiated through a test mask with UV light of an exposed dose of 300 mJ/cm² at 365 nm by use of UV light irradiation apparatus PLA-501 (F) manufactured by Cannon Inc. Then, post exposure bake (PEB) was performed at 120° C. for 1 minute. Thereafter, the PEB processed wafer was developed by immersing in NMD-3 developer (manufactured by Tokyo Ohka Kogyo Co., Ltd.) at 23° C. for at a given period, and was washed with flowing pure water. Then, a post bake was performed at 150° C. for 5 minutes on a hot plate to form a Red negative type pattern. The resolution of the pattern was as follows: pattern to 5 μm in term of line/space was formed without peeling. No foreign matter (particle) was recognized on the pattern coating formed on silicon wafer by visual evaluation under a sodium lamp. In addition, an observations with optical microscope did not detect foreign matter (particle).

Example 18

Dye-containing negative type resist composition (4) prepared in Example 4 was filtered through a 0.2 μm filter, and the resulting filtrate was charged in a washed vial and left at room temperature for two days. Thereafter, the composition was coated on a silicon wafer by means of a spin coater, soft-baked (calcined) at 100° C. for 1 minute on a hot plate to form a coating with film thickness 0.96 μm. The coating was irradiated through a test mask with UV light of an exposed dose of 300 mJ/cm² at 365 nm by use of UV light irradiation apparatus PLA-501 (F) manufactured by Cannon Inc. Then, post exposure bake (PEB) was performed at 120° C. for 1 minute. Thereafter, the PEB processed wafer was developed by immersing in NMD-3 developer (manufactured by Tokyo Ohka Kogyo Co., Ltd.) at 23° C. for at a given period, and was washed with flowing pure water. Then, a post bake was performed at 150° C. for 5 minutes on a hot plate to form a Red negative type pattern. The resolution of the pattern was as follows: pattern to 2 μm in term of line/space was formed without peeling. No foreign matter (particle) was recognized on the pattern coating formed on silicon wafer by visual evaluation under a sodium lamp. In addition, an observations with optical microscope did not detect foreign matter (particle).

Example 19

Dye-containing negative type resist composition (5) prepared in Example 5 was filtered through a 0.2 μm filter, and the resulting filtrate was charged in a washed vial and left at room temperature for two days. Thereafter, the composition was coated on a silicon wafer by means of a spin coater, soft-baked (calcined) at 100° C. for 1 minute on a hot plate to form a coating with film thickness 1.03 μm. The coating was irradiated through a test mask with UV light of an exposed dose of 300 mJ/cm² at 365 nm by use of UV light irradiation apparatus PLA-501 (F) manufactured by Cannon Inc. Then, post exposure bake (PEB) was performed at 120° C. for 1 minute. Thereafter, the PEB processed wafer was developed by immersing in NMD-3 developer (manufactured by Tokyo Ohka Kogyo Co., Ltd.) at 23° C. for at a given period, and was washed with flowing pure water. Then, a post bake was performed at 150° C. for 5 minutes on a hot plate to form a Red negative type pattern. The resolution of the pattern was as follows: pattern to 2 μm in term of line/space was formed without peeling. No foreign matter (particle) was recognized on the pattern coating formed on silicon wafer by visual evaluation under a sodium lamp. In addition, an observations with optical microscope did not detect foreign matter (particle).

Example 20

Dye-containing negative type resist composition (6) prepared in Example 6 was filtered through a 0.2 μm filter, and the resulting filtrate was charged in a washed vial and left at room temperature for two days. Thereafter, the composition was coated on a silicon wafer by means of a spin coater, soft-baked (calcined) at 100° C. for 1 minute on a hot plate to form a coating with film thickness 1.05 μm. The coating was irradiated through a test mask with UV light of an exposed dose of 300 mJ/cm² at 365 nm by use of UV light irradiation apparatus PLA-501 (F) manufactured by Cannon Inc. Then, post exposure bake (PEB) was performed at 120° C. for 1 minute. Thereafter, the PEB processed wafer was developed by immersing in NMD-3 developer (manufactured by Tokyo Ohka Kogyo Co., Ltd.) at 23° C. for at a given period, and was washed with flowing pure water. Then, a post bake was performed at 150° C. for 5 minutes on a hot plate to form a Red negative type pattern. The resolution of the pattern was as follows: pattern to 10 μm in term of line/space was formed without peeling. No foreign matter (particle) was recognized on the pattern coating formed on silicon wafer by visual evaluation under a sodium lamp. In addition, an observations with optical microscope did not detect foreign matter (particle).

Example 21

Dye-containing negative type resist composition (7) prepared in Example 7 was filtered through a 0.2 μm filter, and the resulting filtrate was charged in a washed vial and left at room temperature for two days. Thereafter, the composition was coated on a silicon wafer by means of a spin coater, soft-baked (calcined) at 100° C. for 1 minute on a hot plate to form a coating with film thickness 1.00 μm. The coating was irradiated through a test mask with UV light of an exposed dose of 300 mJ/cm² at 365 nm by use of UV light irradiation apparatus PLA-501 (F) manufactured by Cannon Inc. Then, post exposure bake (PEB) was performed at 120° C. for 1 minute. Thereafter, the PEB processed wafer was developed by immersing in NMD-3 developer (manufactured by Tokyo Ohka Kogyo Co., Ltd.) at 23° C. for at a given period, and was washed with flowing pure water. Then, a post bake was performed at 150° C. for 5 minutes on a hot plate to form a Red negative type pattern. The resolution of the pattern was as follows: pattern to 2 μm in term of line/space was formed without peeling. No foreign matter (particle) was recognized on the pattern coating formed on silicon wafer by visual evaluation under a sodium lamp. In addition, an observations with optical microscope did not detect foreign matter (particle).

Example 22

Dye-containing negative type resist composition (8) prepared in Example 8 was filtered through a 0.2 μm filter, and the resulting filtrate was charged in a washed vial and left at room temperature for two days. Thereafter, the composition was coated on a silicon wafer by means of a spin coater, soft-baked (calcined) at 100° C. for 1 minute on a hot plate to form a coating with film thickness 0.94 μm. The coating was irradiated through a test mask with UV light of an exposed dose of 300 mJ/cm² at 365 nm by use of UV light irradiation apparatus PLA-501 (F) manufactured by Cannon Inc. Then, post exposure bake (PEB) was performed at 120° C. for 1 minute. Thereafter, the PEB processed wafer was developed by immersing in NMD-3 developer (manufactured by Tokyo Ohka Kogyo Co., Ltd.) at 23° C. for at a given period, and was washed with flowing pure water. Then, a post bake was performed at 150° C. for 5 minutes on a hot plate to form a Red negative type pattern. The resolution of the pattern was as follows: pattern to 2 μm in term of line/space was formed without peeling. No foreign matter (particle) was recognized on the pattern coating formed on silicon wafer by visual evaluation under a sodium lamp. In addition, an observations with optical microscope did not detect foreign matter (particle).

Example 23

Dye-containing negative type resist composition (9) prepared in Example 9 was filtered through a 0.2 μm filter, and the resulting filtrate was charged in a washed vial and left at room temperature for two days. Thereafter, the composition was coated on a silicon wafer by means of a spin coater, soft-baked (calcined) at 100° C. for 1 minute on a hot plate to form a coating with film thickness 1.10 μm. The coating was irradiated through a test mask with UV light of an exposed dose of 300 mJ/cm² at 365 nm by use of UV light irradiation apparatus PLA-501 (F) manufactured by Cannon Inc. Then, post exposure bake (PEB) was performed at 120° C. for 1 minute. Thereafter, the PEB processed wafer was developed by immersing in NMD-3 developer (manufactured by Tokyo Ohka Kogyo Co., Ltd.) at 23° C. for at a given period, and was washed with flowing pure water. Then, a post bake was performed at 150° C. for 5 minutes on a hot plate to form a Green negative type pattern. The resolution of the pattern was as follows: pattern to 2 μm in term of line/space was formed without peeling. No foreign matter (particle) was recognized on the pattern coating formed on silicon wafer by visual evaluation under a sodium lamp. In addition, an observations with optical microscope did not detect foreign matter (particle).

Example 24

Dye-containing negative type resist composition (10) prepared in Example 10 was filtered through a 0.2 μm filter, and the resulting filtrate was charged in a washed vial and left at room temperature for two days. Thereafter, the composition was coated on a silicon wafer by means of a spin coater, soft-baked (calcined) at 100° C. for 1 minute on a hot plate to form a coating with film thickness 0.98 μm. The coating was irradiated through a test mask with UV light of an exposed dose of 300 mJ/cm² at 365 nm by use of UV light irradiation apparatus PLA-501 (F) manufactured by Cannon Inc. Then, post exposure bake (PEB) was performed at 120° C. for 1 minute. Thereafter, the PEB processed wafer was developed by immersing in NMD-3 developer (manufactured by Tokyo Ohka Kogyo Co., Ltd.) at 23° C. for at a given period, and was washed with flowing pure water. Then, a post bake was performed at 150° C. for 5 minutes on a hot plate to form a Green negative type pattern. The resolution of the pattern was as follows: pattern to 2 μm in term of line/space was formed without peeling. No foreign matter (particle) was recognized on the pattern coating formed on silicon wafer by visual evaluation under a sodium lamp. In addition, an observations with optical microscope did not detect foreign matter (particle).

Example 25

Dye-containing negative type resist composition (11) prepared in Example 11 was filtered through a 0.2 μm filter, and the resulting filtrate was charged in a washed vial and left at room temperature for two days. Thereafter, the composition was coated on a silicon wafer by means of a spin coater, soft-baked (calcined) at 100° C. for 1 minute on a hot plate to form a coating with film thickness 1.00 μm. The coating was irradiated through a test mask with UV light of an exposed dose of 300 mJ/cm² at 365 nm by use of UV light irradiation apparatus PLA-501 (F) manufactured by Cannon Inc. Then, post exposure bake (PEB) was performed at 130° C. for 1 minute. Thereafter, the PEB processed wafer was developed by immersing in NMD-3 developer (manufactured by Tokyo Ohka Kogyo Co., Ltd.) at 23° C. for at a given period, and was washed with flowing pure water. Then, a post bake was performed at 150° C. for 5 minutes on a hot plate to form a Blue negative type pattern. The resolution of the pattern was as follows: pattern to 2 μm in term of line/space was formed without peeling. No foreign matter (particle) was recognized on the pattern coating formed on silicon wafer by visual evaluation under a sodium lamp. In addition, an observations with optical microscope did not detect foreign matter (particle).

Example 26

Dye-containing negative type resist composition (12) prepared in Example 12 was filtered through a 0.2 μm filter, and the resulting filtrate was charged in a washed vial and left at room temperature for two days. Thereafter, the composition was coated on a silicon wafer by means of a spin coater, soft-baked (calcined) at 100° C. for 1 minute on a hot plate to form a coating with film thickness 0.94 μm. The coating was irradiated through a test mask with UV light of an exposed dose of 300 mJ/cm² at 365 nm by use of UV light irradiation apparatus PLA-501 (F) manufactured by Cannon Inc. Then, post exposure bake (PEB) was performed at 130° C. for 1 minute. Thereafter, the PEB processed wafer was developed by immersing in NMD-3 developer (manufactured by Tokyo Ohka Kogyo Co., Ltd.) at 23° C. for at a given period, and was washed with flowing pure water. Then, a post bake was performed at 150° C. for 5 minutes on a hot plate to form a Blue negative type pattern. The resolution of the pattern was as follows: pattern to 2 μm in term of line/space was formed without peeling. No foreign matter (particle) was recognized on the pattern coating formed on silicon wafer by visual evaluation under a sodium lamp. In addition, an observations with optical microscope did not detect foreign matter (particle).

Example 27

Dye-containing negative type resist composition (13) prepared in Example 13 was filtered through a 0.2 μm filter, and the resulting filtrate was charged in a washed vial and left at room temperature for two days. Thereafter, the composition was coated on a silicon wafer by means of a spin coater, soft-baked (calcined) at 100° C. for 1 minute on a hot plate to form a coating with film thickness 0.94 μm. The coating was irradiated through a test mask with UV light of an exposed dose of 300 mJ/cm$^2$ at 365 nm by use of UV light irradiation apparatus PLA-501 (F) manufactured by Cannon Inc. Then, post exposure bake (PEB) was performed at 130° C. for 1 minute. Thereafter, the PEB processed wafer was developed by immersing in NMD-3 developer (manufactured by Tokyo Ohka Kogyo Co., Ltd.) at 23° C. for at a given period, and was washed with flowing pure water. Then, a post bake was performed at 150° C. for 5 minutes on a hot plate to form a Blue negative type pattern. The resolution of the pattern was as follows: pattern to 2 μm in term of line/space was formed without peeling. No foreign matter (particle) was recognized on the pattern coating formed on silicon wafer by visual evaluation under a sodium lamp. In addition, an observations with optical microscope did not detect foreign matter (particle).

Example 28

Dye-containing negative type resist composition (14) prepared in Example 14 was filtered through a 0.2 μm filter, and the resulting filtrate was charged in a washed vial and left at room temperature for two days. Thereafter, the composition was coated on a silicon wafer by means of a spin coater, soft-baked (calcined) at 100° C. for 1 minute on a hot plate to form a coating with film thickness 0.95 μm. The coating was irradiated through a test mask with UV light of an exposed dose of 300 mJ/cm$^2$ at 365 nm by use of UV light irradiation apparatus PLA-501 (F) manufactured by Cannon Inc. Then, post exposure bake (PEB) was performed at 130° C. for 1 minute. Thereafter, the PEB processed wafer was developed by immersing in NMD-3 developer (manufactured by Tokyo Ohka Kogyo Co., Ltd.) at 23° C. for at a given period, and was washed with flowing pure water. Then, a post bake was performed at 150° C. for 5 minutes on a hot plate to form a Blue negative type pattern. The resolution of the pattern was as follows: pattern to 2 μm in term of line/space was formed without peeling. No foreign matter (particle) was recognized on the pattern coating formed on silicon wafer by visual evaluation under a sodium lamp. In addition, an observations with optical microscope did not detect foreign matter (particle).

Comparative Example 5

Dye-containing negative type resist composition (15) prepared in Comparative Example 1 was filtered through a 0.2 μm filter, and the resulting filtrate was charged in a washed vial and left at room temperature for two days. Thereafter, the composition was coated on a silicon wafer by means of a spin coater, soft-baked (calcined) at 100° C. for 1 minute on a hot plate to form a coating with film thickness 1.04 μm. The coating was irradiated through a test mask with UV light of an exposed dose of 300 mJ/cm$^2$ at 365 nm by use of UV light irradiation apparatus PLA-501 (F) manufactured by Cannon Inc. Then, post exposure bake (PEB) was performed at 130° C. for 1 minute. Thereafter, the PEB processed wafer was developed by immersing in NMD-3 developer (manufactured by Tokyo Ohka Kogyo Co., Ltd.) at 23° C. for at a given period, and was washed with flowing pure water. Then, a post bake was performed at 150° C. for 5 minutes on a hot plate to form a Red negative type pattern. The resolution of the pattern was as follows: pattern to 2 μm in term of line/space was formed without peeling. However, 50 or more of foreign matters (particles) were recognized on the pattern coating formed on silicon wafer by visual evaluation under a sodium lamp. In addition, an observations with optical microscope detected foreign matters (particles) having a size of 2 to 3 μm.

Comparative Example 6

Dye-containing negative type resist composition (16) prepared in Comparative Example 2 was filtered through a 0.2 μm filter, and the resulting filtrate was charged in a washed vial and left at room temperature for two days. Thereafter, the composition was coated on a silicon wafer by means of a spin coater, soft-baked (calcined) at 100° C. for 1 minute on a hot plate to form a coating with film thickness 1.00 μm. The coating was irradiated through a test mask with UV light of an exposed dose of 300 mJ/cm$^2$ at 365 nm by use of UV light irradiation apparatus PLA-501 (F) manufactured by Cannon Inc. Then, post exposure bake (PEB) was performed at 130° C. for 1 minute. Thereafter, the PEB processed wafer was developed by immersing in NMD-3 developer (manufactured by Tokyo Ohka Kogyo Co., Ltd.) at 23° C. for at a given period, and was washed with flowing pure water. Then, a post bake was performed at 150° C. for 5 minutes on a hot plate to form a Green negative type pattern. The resolution of the pattern was as follows: pattern to 2 μm in term of line/space was formed without peeling. However, 50 or more of foreign matters (particles) were recognized on the pattern coating formed on silicon wafer by visual evaluation under a sodium lamp. In addition, an observations with optical microscope detected foreign matters (particles) having a size of 2 to 4 μm.

Comparative Example 7

Dye-containing negative type resist composition (17) prepared in Comparative Example 3 was filtered through a 0.2 μm filter, and the resulting filtrate was charged in a washed vial and left at room temperature for two days. Thereafter, the composition was coated on a silicon wafer by means of a spin coater, soft-baked (calcined) at 100° C. for 1 minute on a hot plate to form a coating with film thickness 0.94 μm. The coating was irradiated through a test mask with UV light of an exposed dose of 300 mJ/cm$^2$ at 365 nm by use of UV light irradiation apparatus PLA-501 (F) manufactured by Cannon Inc. Then, post exposure bake (PEB) was performed at 130° C. for 1 minute. Thereafter, the PEB processed wafer was developed by immersing in NMD-3 developer (manufactured by Tokyo Ohka Kogyo Co., Ltd.) at 23° C. for at a given period, and was washed with flowing pure water. Then, a post bake was performed at 150° C. for 5 minutes on a hot plate to form a Blue negative type pattern. The resolution of the pattern was as follows: pattern to 2 μm in term of line/space was formed without peeling. However, 50 or more of foreign matters (particles) were recognized on the pattern coating formed on silicon wafer by visual evaluation under a sodium lamp. In addition, an observations with optical microscope detected foreign matters (particles) having a size of 2 to 4 μm.

Comparative Example 8

Dye-containing negative type resist composition (18) prepared in Comparative Example 4 was filtered through a 0.2 μm filter, and the resulting filtrate was charged in a washed vial and left at room temperature for two days. Thereafter, the composition was coated on a silicon wafer by means of a spin coater, soft-baked (calcined) at 100° C. for 1 minute on a hot plate to form a coating with film thickness 0.99 μm. The coating was irradiated through a test mask with UV light of an exposed dose of 300 mJ/cm$^2$ at 365 nm by use of UV light irradiation apparatus PLA-501 (F) manufactured by Cannon Inc. Then, post exposure bake (PEB) was performed at 130° C. for 1 minute. Thereafter, the PEB processed wafer was developed by immersing in NMD-3 developer (manufactured by Tokyo Ohka Kogyo Co., Ltd.) at 23° C. for at a given period, and was washed with flowing pure water. Then, a post bake was performed at 150° C. for 5 minutes on a hot plate to form a Blue negative type pattern. The resolution of the pattern was as follows: pattern to 2 μm in term of line/space was formed without peeling. However, 50 or more of foreign matters (particles) were recognized on the pattern coating formed on silicon wafer by visual evaluation under a sodium lamp. In addition, an observations with optical microscope detected foreign matters (particles) having a size of 2 to 4 μm.

INDUSTRIAL APPLICABILITY

As the dye-containing negative type resist composition or positive type resist composition from which resists are formed through crosslinking, polymerization or depolymerizaton with heat or light irradiation, which the present invention provides, contains ketol solvents, preferably β-hydroxyketone, more preferably 4-hydroxy-4-methyl-2-pentanone, solubility of dyes and compatibility of dyes with resins are increased, and a prescribed concentration of the dyes can be secured. Thereby, the present invention can provide color filters which can realize a development of a prescribed emission spectrum, and also can provide solid-state image sensing devices, liquid crystal display devices and light emitting diode display devices by use of the color filters. Further, the resist compositions of the present invention can inhibit occurrence of foreign matter (particle) upon the storage thereof by containing 4-hydroxy-4-methyl-2-pentanone.

What is claimed is:

1. A dye-containing resist composition selected from the group consisting of:
    a negative type resist composition comprising a resin (a-1), a photoacid generator or a photobase generator (b-1), a crosslinking compound (c-1), a dye (d) and a ketol solvent (e);
    a negative type resist composition comprising a resin (a-2), a photoradical generator (b-2), a crosslinking compound (c-2), a dye (d) and a ketol solvent (e); and
    a positive type resist composition comprising a resin (a-3), a photoacid generator (b-3), a crosslinking compound (c-3), a dye (d) and a ketol solvent (e);
    wherein the dye (d) has an emission spectrum suitable for color filter, and is contained in an amount of 30 to 90% by weight based on solid content, and
    the ketol solvent (e) is β-hydroxyketone.

2. The resist composition according to claim 1, wherein the solvent contains at least 1% by weight of a β-hydroxyketone based on total solvent.

3. The resist composition according to claim 1, wherein the β-hydroxyketone is 4-hydroxy-4-methyl-2-pentanone.

4. A method of producing a color filter comprising the steps of:
    coating the resist composition according to claim 1 on a substrate;
    drying;
    exposing; and
    developing.

5. A color filter produced by the method according to claim 4.

6. A solid-state image sensing device having the color filter produced by the method according to claim 4.

7. A liquid crystal display device having the color filter produced by the method according to claim 4.

8. A light emitting diode display device having the color filter produced by the method according to claim 4.

* * * * *